(12) United States Patent
Naito

(10) Patent No.: US 11,356,062 B2
(45) Date of Patent: Jun. 7, 2022

(54) ELECTRIC CIRCUIT AND ELECTRONIC APPARATUS

(71) Applicant: SONY SEMICONDUCTOR SOLUTIONS CORPORATION, Kanagawa (JP)

(72) Inventor: Takahiro Naito, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 62 days.

(21) Appl. No.: 16/473,839

(22) PCT Filed: Dec. 19, 2017

(86) PCT No.: PCT/JP2017/045502
§ 371 (c)(1),
(2) Date: Jun. 26, 2019

(87) PCT Pub. No.: WO2018/146949
PCT Pub. Date: Aug. 16, 2018

(65) Prior Publication Data
US 2020/0014333 A1 Jan. 9, 2020

(30) Foreign Application Priority Data
Feb. 8, 2017 (JP) ............................. JP2017-021121

(51) Int. Cl.
*H03F 1/02* (2006.01)
*G05F 1/46* (2006.01)
*H03F 3/347* (2006.01)

(52) U.S. Cl.
CPC ............. *H03F 1/0211* (2013.01); *G05F 1/46* (2013.01); *H03F 3/347* (2013.01)

(58) Field of Classification Search
CPC ........ H03F 1/0211; H03F 3/347; H03F 3/343; G05F 1/46; H03K 19/00
(Continued)

(56) References Cited

U.S. PATENT DOCUMENTS 6,172,882 B1 * 1/2001 Tanaka ................ H02M 7/5387
363/17
9,231,488 B2 * 1/2016 Zhu ........................ H02M 3/337
2015/0077177 A1 3/2015 Ogawa et al.

FOREIGN PATENT DOCUMENTS

JP 62-053007 A 3/1987
JP 2000-243915 A 9/2000
(Continued)

OTHER PUBLICATIONS

International Search Report and Written Opinion of PCT Application No. PCT/JP2017/045502 dated Mar. 20, 2018, 09 pages of ISRWO.

*Primary Examiner* — Khanh V Nguyen
*Assistant Examiner* — Khiem D Nguyen
(74) *Attorney, Agent, or Firm* — Chip Law Group

(57) ABSTRACT

An electric circuit according to one embodiment of the present technology includes a target circuit and an auxiliary circuit. The target circuit includes an output portion from which predetermined output power is output, and an application point to which a voltage corresponding to the output power is applied to output the output power. The auxiliary circuit has impedance lower than impedance of the target circuit, and outputs the voltage corresponding to the output power to the application point as an auxiliary voltage.

14 Claims, 18 Drawing Sheets

(58) Field of Classification Search
USPC .................................. 330/277, 51, 296, 285
See application file for complete search history.

(56) References Cited

FOREIGN PATENT DOCUMENTS

| | | |
|---|---|---|
| JP | 2003-223153 A | 8/2003 |
| JP | 2012-099065 A | 5/2012 |
| JP | 2015-084201 A | 4/2015 |

\* cited by examiner

ELECTRIC CIRCUIT AND ELECTRONIC APPARATUS

CROSS REFERENCE TO RELATED APPLICATIONS

This application is a U.S. National Phase of International Patent Application No. PCT/JP2017/045502 filed on Dec. 19, 2017, which claims priority benefit of Japanese Patent Application No. JP 2017-021121 filed in the Japan Patent Office on Feb. 8, 2017. Each of the above-referenced applications is hereby incorporated herein by reference in its entirety.

TECHNICAL FIELD

The present technology relates to an electric circuit which can be applied to an arbitrary device such as a mobile device, and an electronic apparatus.

BACKGROUND ART

Recently, a small device such as a mobile device, a wearable device, and an internet of things (IoT) device has been widely used. The power consumption of such a device is suppressed, and thus, for example, it is possible to save a built-in battery and the like which are mounted on the device. Accordingly, various technologies for realizing low power consumption of such a device have been developed.

For example, in Patent Literature 1, a reference voltage source circuit which is operated by a current of a nanoampere level is described. In the reference voltage source circuit, a bandgap voltage is generated by using a current of approximately 10 nA which is generated in a current source circuit. In addition, the bandgap voltage is divided by a voltage-dividing circuit using a metal oxide semiconductor (MOS) transistor in which voltage depression can be performed at a current of a nanoampere level, and a sub-bandgap voltage is output. Thus, in the reference voltage source circuit described in Patent Literature 1, a current flowing a circuit is maintained at a nanoampere level, and low power consumption of the circuit is realized (Specification Paragraphs [0047], [0089], and [0119], FIG. 19, and the like in Patent Literature 1).

CITATION LIST

Patent Literature

Patent Literature 1: JP-A-2012-99065

SUMMARY OF INVENTION

Technical Problem

It is considered that a device will be downsized in various fields or applications in the future, and a technology which is capable of realizing low power consumption is required.

In consideration of the circumstances described above, an object of the present technology is to provide an electric circuit which is capable of realizing low power consumption, and an electronic apparatus.

Solution to Problem

In order to attain the object described above, an electric circuit according to one embodiment of the present technology includes a target circuit and an auxiliary circuit.

The target circuit includes an output portion from which predetermined output power is output, and an application point to which a voltage corresponding to the output power is applied to output the output power.

The auxiliary circuit has impedance lower than impedance of the target circuit, and outputs the voltage corresponding to the output power to the application point as an auxiliary voltage.

In the electric circuit, the voltage corresponding to the output power is applied to the application point in the target circuit, and the predetermined output power is output from the output portion. The voltage corresponding to the output power is output to the application point as the auxiliary voltage by the auxiliary circuit, and thus, it is possible to sufficiently reduce a time to perform a stationary operation from the start. Accordingly, it is possible to realize low power consumption.

The auxiliary circuit may output the auxiliary voltage to the application point in accordance with a start-up timing of the target circuit.

Accordingly, the auxiliary voltage is output to the application point in accordance with the start-up timing of the target circuit. As a result thereof, it is possible to sufficiently reduce a start-up time of the target circuit.

The target circuit may include a first wiring portion which is connected to a first power supply source, and in which impedance to the application point is first impedance. In this case, the auxiliary circuit may include a second wiring portion which is connected to a second power supply source, and in which impedance to the application point is second impedance lower than the first impedance.

Accordingly, for example, it is possible to adopt a high-impedance configuration in which a current flowing the target circuit is sufficiently reduced, and it is possible to realize sufficiently low power consumption.

The first power supply source and the second power supply source may be an identical power supply source.

Accordingly, it is possible for the auxiliary circuit to output the auxiliary voltage at a timing identical to the start-up timing of the target circuit, and it is possible to sufficiently reduce the start-up time of the target circuit.

The second wiring portion may be connected to the application point, pass a high-frequency current, and regulate a stationary current.

Accordingly, for example, a high-frequency current according to the start flows into the application point, and the voltage of the application point is raised. As a result thereof, it is possible to sufficiently reduce the start-up time of the target circuit.

The auxiliary circuit may include a capacitance circuit which is provided to output the auxiliary voltage.

Accordingly, for example, it is possible to easily provide a circuit which outputs the auxiliary voltage.

The second wiring portion may include a start-up switch portion which is connected to the application point, is capable of passing a stationary current, and is provided between the second power supply source and the application point.

Accordingly, for example, it is possible to control a current flowing into the application point, and the like. As a result thereof, for example, it is possible to use an arbitrary circuit which is driven by a stationary current, and the degree of freedom of circuit design is improved.

The start-up switch portion may make a path between the second power supply source and the application point conductive in accordance with a start-up timing of the target circuit, and may cut off the path after a predetermined time has elapsed.

Accordingly, it is possible to output the auxiliary voltage to the application point in accordance with the start-up timing of the target circuit. As a result thereof, it is possible to reduce the start-up time of the target circuit, and it is possible to realize low power consumption.

The auxiliary circuit may include at least one of a resistance circuit for outputting the auxiliary voltage or a replica circuit which outputs the auxiliary voltage.

For example, it is possible to output the auxiliary voltage by using the resistance circuit or the replica circuit according to the properties and the like of the target circuit. As a result thereof, it is possible to reduce a start-up time of various target circuits.

The first wiring portion and the second wiring portion may include a common wiring portion which is wiring common to each of the first wiring portion and the second wiring portion. In this case, the start-up switch portion may be provided on wiring of the second wiring portion, the wiring being different from the common wiring portion.

Accordingly, the common wiring is used, and thus, it is possible to decrease the area of the circuit, and it is possible to downsize the circuit.

Wiring of the first wiring portion, which is different from the common wiring portion, may be configured to have high impedance. In this case, the wiring of the second wiring portion, which is different from the common wiring portion and is provided with the start-up switch portion, may be configured to have low impedance.

For example, high-impedance wiring is switched to low-impedance wiring, and thus, it is possible to rapidly raise the voltage of an application portion, and it is possible to reduce the start-up time of the target circuit.

The output portion may output a predetermined voltage as the output power. In this case, the auxiliary circuit may output the predetermined voltage to the application point as the auxiliary voltage.

Accordingly, it is possible to rapidly raise the voltage of the application point to the predetermined voltage. As a result thereof, it is possible to sufficiently reduce the time to perform the stationary operation from the start.

The output portion may include an output point which outputs the output power. In this case, the auxiliary circuit may output the predetermined voltage to the output point of the output portion as the auxiliary voltage.

Accordingly, it is possible to rapidly raise the voltage of the output point to the predetermined voltage. As a result thereof, it is possible to sufficiently reduce the time to perform the stationary operation from the start.

The target circuit may perform an intermittent operation of alternately repeating a start-up state in which the output power is output and a dormant state.

Accordingly, for example, it is possible to start up the target circuit only when the output power is necessary, and the power consumption of the target circuit is sufficiently suppressed. As a result thereof, it is possible to realize sufficiently low power consumption.

The electric circuit may further include an intermittent switch portion which is provided between the first wiring portion and the first power supply source. In this case, the target circuit may be in the start-up state in a case in which the intermittent switch portion is turned ON, and may be in the dormant state in a case in which the intermittent switch portion is turned OFF.

Accordingly, the intermittent operation of the target circuit is controlled with a high accuracy, and it is possible to realize an electric circuit of extremely low power consumption.

The intermittent switch portion may include a first switch portion which is provided between the first wiring portion and the first power supply source, and a second switch portion which is provided between the second wiring portion and the second power supply source and is operated in synchronization with the first switch portion.

Accordingly, for example, it is possible to simultaneously start up the target circuit and the auxiliary circuit, and it is possible to perform the start of the target circuit and the output of the auxiliary voltage at the same timing. As a result thereof, it is possible to sufficiently reduce the start-up time of the target circuit.

The second wiring portion may include a start-up switch portion which is connected to the application point, is capable of passing a stationary current, and is provided between the second power supply source and the application point. In this case, the intermittent switch portion and the start-up switch portion may be operated in synchronization with each other.

Accordingly, it is possible to output the auxiliary voltage at a proper timing in accordance with the intermittent operation, and it is possible to reduce the start-up time of the target circuit. As a result thereof, it is possible to realize sufficiently low power consumption.

The target circuit may include a plurality of the application points to each of which a voltage corresponding to the output power is applied, when the output power is output In this case, the auxiliary circuit may output an auxiliary voltage corresponding to each of the plurality of application points.

Accordingly, a potential according to the output power is output to each of the plurality of application points as the auxiliary potential. As a result thereof, it is possible to sufficiently reduce start-up time of the target circuit.

An electronic apparatus according to one embodiment of the present technology includes an electric circuit and a driving unit.

The electric circuit includes the target circuit and the auxiliary circuit.

The driving unit is driven by the output power which is output from the output portion of the target circuit.

Advantageous Effects of Invention

As described above, according to the present technology, it is possible to provide an electric circuit which is capable of realizing low power consumption. Note that, the effects described here are not necessarily limited, and may be any of the effects described in this disclosure.

MODE(S) FOR CARRYING OUT THE INVENTION

Hereinafter, embodiments according to the present technology will be described with reference to the drawings.

First Embodiment

[Configuration of Electric Circuit]

Figure 1:
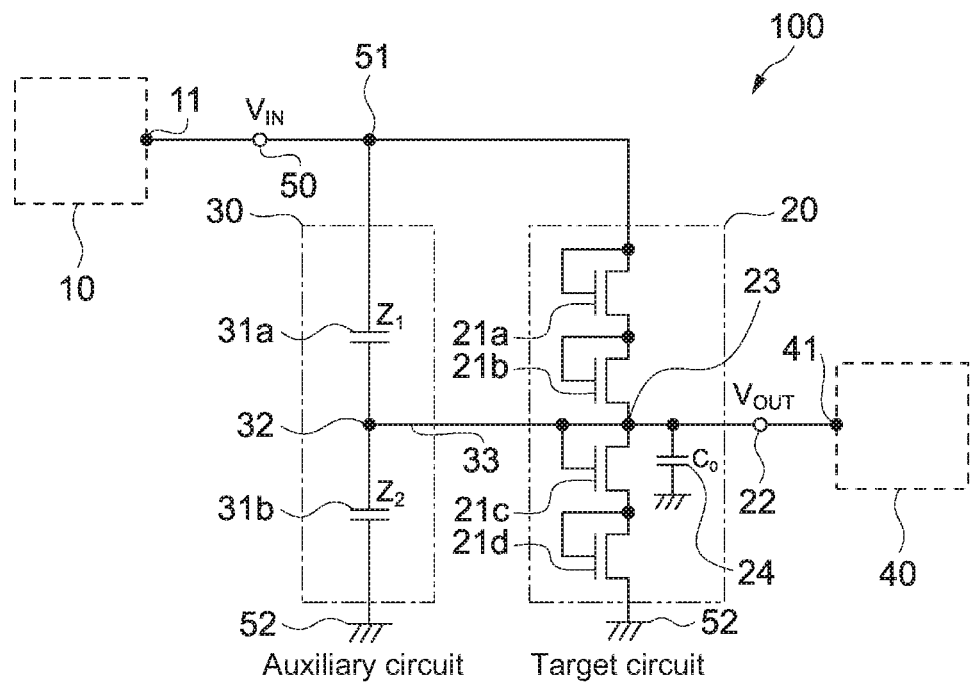
FIG. 1 is a circuit diagram illustrating a configuration example of an electric circuit according to a first embodiment of the present technology.

FIG. 1 is a circuit diagram illustrating a configuration example of an electric circuit according to a first embodiment of the present technology. An electric circuit 100, for example, is mounted on an electronic apparatus such as a mobile device such as a mobile terminal, a wearable device which is used by being mounted on the body, and an IoT device which is driven by a battery. The present technology can also be applied to an electronic apparatus used for other application.

The electric circuit 100 includes a power supply source 10, a target circuit 20, an auxiliary circuit 30, and a driving circuit 40. In addition, the electric circuit 100 includes an input point 50, a branch point 51, and a ground point 52 (GND).

The power supply source 10 includes an output terminal 11. The power supply source 10 is driven by a power source such as a battery (not illustrated), and outputs predetermined power from the output terminal 11. For example, a reference voltage source which is capable of outputting a reference voltage such as a bandgap voltage, a constant voltage source which is capable of outputting a predetermined voltage, and the like are used as power supply source 10. In addition, an arbitrary circuit and the like which are capable of supplying power may be suitably used.

As illustrated in FIG. 1, in this embodiment, an input voltage $V_{IN}$ is output as the predetermined power. A voltage value, a waveform, and the like of the input voltage $V_{IN}$ are not limited.

In this embodiment, the power supply source 10 corresponds to a first power supply source and a second power supply source. That is, in this embodiment, the same power supply source 10 is used as the first power supply source and the second power supply source.

The output terminal 11 of the power supply source 10 is connected to the branch point 51 through the input point 50. The branch point 51 is connected to each of the target circuit 30 and the auxiliary circuit 20.

The target circuit 20 includes a first MOS transistor 21a to a fourth MOS transistor 21d, an output point 22, an application point 23, and a capacitor portion 24. In FIG. 1, a circuit corresponding to the target circuit is schematically illustrated by being surrounded with a quadrangle of a dashed-two dotted line.

The first MOS transistor 21a to the fourth MOS transistor 21d are an n-type MOS transistor, and in the example illustrated in FIG. 1, an upper side is a drain, and a lower side is a source. Each of the MOS transistors has a diode-connected configuration in which each gate is short-circuited to the own drain.

The first MOS transistor 21a to the fourth MOS transistor 21d which are diode-connected are connected in series between the branch point 51 and the ground point 52 in this order. That is, a drain of the first MOS transistor 21a is connected to the branch point 51, a source is connected to a drain of the second MOS transistor 21b. A source of the second MOS transistor 21b is connected to a drain of the third MOS transistor 21c. A source of the third MOS transistor 21c is connected to a drain of the fourth MOS transistor 21d. A source of the fourth MOS transistor 21d is connected to the ground point 52.

The first MOS transistor 21a to the fourth MOS transistor 21d function as an MOS transistor resistance which is operated in a subthreshold region. That is, each of the MOS transistors functions as a high-impedance resistance element. In addition, a gate length and a gate width of each of the MOS transistors are set to values identical to each other, and properties such as an impedance value of each of the MOS transistors are approximately identical to each other. Thus, the target circuit 20 has a configuration of a voltage-dividing circuit including MOS transistor resistances which are connected in series.

The output point 22 is a point from which predetermined output power generated by the target circuit 20 is output. In this embodiment, the output point 22 is provided on wiring which is at a potential identical to that of the source of the second MOS transistor 21b and the drain of the third MOS transistor 21c. Note that, a position in which the output point 22 is provided is not limited, and for example, the output point 22 may be provided between the first MOS transistor 21a and the second MOS transistor 21b, or between the third MOS transistor 21c and the fourth MOS transistor 21d. In FIG. 1, the output point 22 is schematically illustrated outside the target circuit 20 (the quadrangle of the dashed-two dotted line).

An output voltage $V_{OUT}$ is output from the output point 22 as the output power. In this embodiment, the input voltage $V_{IN}$ which is input into the input point 50 (the branch point 51) is divided by synthetic impedance of the first MOS transistor 21a and the second MOS transistor 21b, and synthetic impedance of the third MOS transistor 21c and the fourth MOS transistor 21d, and is output from the output point 22. Accordingly, the value of the output voltage $V_{OUT}$ is ½ of the input voltage $V_{IN}$. In this embodiment, the output point 22 corresponds to an output portion, and the output voltage $V_{OUT}$ corresponds to a predetermined voltage as the predetermined output power.

The application point 23 is a point to which a voltage corresponding to the output power is applied in order for the target circuit 20 to output the output power. As illustrated in FIG. 1, the application point 23 is provided on wiring which is at a potential identical to that of the source of the second MOS transistor 21b and the drain of the third MOS transistor 21c. That is, the application point 23 is provided on wiring which is at a potential identical to that of the output point 22.

In this embodiment, a path from the branch point 51 to the application point 23 through the first MOS transistor 21a and the second MOS transistor 21b corresponds to a first wiring portion. In addition, the synthetic impedance of the first MOS transistor 21a and the second MOS transistor 21b corresponds to first impedance.

The capacitor portion 24 is a capacitance element for stabilizing the operation of the target circuit 20. The capacitor portion 24 is provided between the wiring which is at the potential identical to that of the source of the second MOS transistor 21b and the drain of the third MOS transistor 21c, and the GND. In FIG. 1, a capacitance element of which an electrostatic capacitance is C0 is used as the capacitor portion 24. Note that, in an actual circuit, an electrostatic capacitance considering a parasite capacitance of a circuit, and the like is set.

Note that, there may be a case in which the capacitance element for stabilizing the operation, and the like are not provided in the target circuit 20. In this case, the capacitor portion 24 illustrated in FIG. 1 schematically represents a parasite capacitance and the like included in the target circuit 20, and the following description is applied to the capacitor portion 24. For example, the expression of "the capacitor portion 24 is charged" can be replaced with the expression of "the parasite capacitance is charged." That is, the present technology can be applied to both of a case in which the capacitance element for stabilizing the target circuit 20 is arranged and a case in which the capacitance element is not arranged (for example, the case of only the parasite capacitance).

The auxiliary circuit 30 includes a first capacitor 31a and a second capacitor 31b, an intermediate point 32, and connection wiring 33. In FIG. 1, a circuit corresponding to the auxiliary circuit 30 is schematically illustrated by being surrounded with a quadrangle of a dashed-dotted line.

The first capacitor 31a is provided between the branch point 51 and the intermediate point 32. The second capacitor 31b is provided between the intermediate point 32 and the ground point 52. That is, the first capacitor 31a and the second capacitor 31b are connected in series between the branch point 51 and the ground point 52 in this order.

For example, a value greater than the electrostatic capacitance C0 of the capacitor portion 24 of the target circuit 20 is set as an electrostatic capacitance of the first capacitor 31a and the second capacitor 31b. In addition, impedance values of the first capacitor 31a and the second capacitor 31b are Z1 and Z2, respectively. In this embodiment, Z1 and Z2 are set to be approximately identical to each other (Z1=Z2). The present technology is not limited thereto, and for example, the value of the electrostatic capacitance or the impedance of each of the capacitors may be suitably set in accordance with the configuration, the type, and the like of the target circuit 20.

Thus, in the auxiliary circuit 30, a voltage-dividing circuit is configured of the capacitance circuit including the first capacitor 31a and the second capacitor 31b which are connected in series. In the example illustrated in FIG. 1, the input voltage $V_{IN}$ is divided by the impedance (Z1 and Z2) of the first capacitor 31a and the second capacitor 31b. Accordingly, a voltage between the respective capacitors (of the intermediate point 32) (a potential difference with respect to GND) is ½ of the input voltage $V_{IN}$. That is, a voltage-dividing circuit which performs voltage-dividing identical to that of the target circuit 20 is provided in the auxiliary circuit 30.

The intermediate point 32 of the auxiliary circuit 30 is connected to the application point 23 of the target circuit 20 through the connection wiring 33. In this embodiment, a path from the branch point 51 to the application point 23 through the first capacitor 31a, the intermediate point 32, and the connection wiring 33 corresponds to a second wiring portion. In addition, impedance Z1 of the first capacitor 31a corresponds to second impedance.

In general, the impedance of a capacitor has frequency dependency. For example, the capacitor functions as a high-impedance element with respect to a stationary current (a direct current) or a low-frequency current, and functions as a low-impedance element with respect to a high-frequency current.

In the auxiliary circuit 20 illustrated in FIG. 1, a high-frequency current which is input into the first capacitor 31a from the power supply source 10 is passed, and a stationary current is regulated. That is, the first capacitor 31a functions as a low-impedance element with respect to the high-frequency current.

For example, a high-frequency current is included in the rise of the input voltage $V_{IN}$. The high-frequency current passes through the first capacitor 31a, and flows into the application point 23 of the target circuit 20. On the other hand, a stationary current which is generated by a constant voltage after the input voltage $V_{IN}$ is raised is regulated by the first capacitor 31a. Note that, the high-frequency current, for example, is an alternating current having a cycle shorter than a time required for raising the input voltage $V_{IN}$. It is obvious that the present technology is not limited thereto.

In this embodiment, the impedance Z1 of the first capacitor 31a included in the second wiring portion is set to be lower with respect to the high-frequency current than the synthetic impedance of the first MOS transistor 21a and the second MOS transistor 21b included in the first wiring portion. Accordingly, the second impedance relevant to the high-frequency current is set to a value less than that of the first impedance.

The driving circuit 40 includes an input terminal 41. The input terminal 41 is connected to the output point 22 of the target circuit 40. The driving circuit 40 is a circuit driven by the output power which is output by the target circuit 20. For example, an arbitrary integrated circuit such as an operational amplifier is used as the driving circuit 40. In addition, an arbitrary circuit which is mounted on an electronic apparatus and the like may be used as the driving circuit 40.

Figure 2:
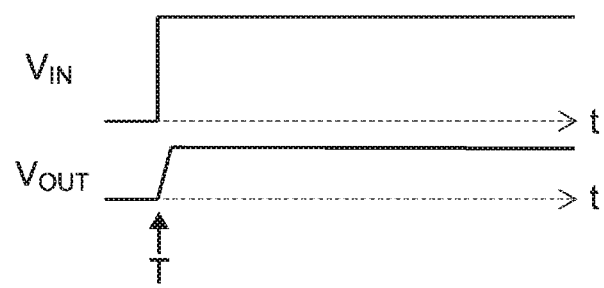
FIG. 2 is a schematic view for illustrating an operation waveform of the electric circuit illustrated in FIG. 1.

FIG. 2 is a schematic view for illustrating an operation waveform of the electric circuit 100 illustrated in FIG. 1. In FIG. 2, the waveform of the input voltage $V_{IN}$ which is output from the power supply unit 10, and the waveform of the output voltage $V_{OUT}$ which is output from the target circuit 20 in accordance with the input voltage $V_{IN}$ are schematically illustrated along a time axis t. Note that, in the drawing, the time T is a time when the input voltage $V_{IN}$ is output by the power supply unit 10, and corresponds to a start-up timing of the target circuit 20.

The input voltage $V_{IN}$ which is output to the input point 50 at the time T is input into the auxiliary circuit 30 and the target circuit 20 through the branch point 51 at the same timing. In the auxiliary circuit 30, the high-frequency current included in the portion of the rise of the input voltage $V_{IN}$ passes through the first capacitor 31a, and flows into the application point 23 of the target circuit 20 from the intermediate point 32 through the connection wiring 33. The high-frequency current which flows into the application point 23 flows to the capacitor portion 24 which is connected to a potential identical to that of the application point 23, and the capacitor portion 24 is charged.

In addition, in the auxiliary circuit 30, the input voltage $V_{IN}$ is divided into ½, and the voltage of the intermediate point 32 is promptly raised to $V_{IN}/2$. In this embodiment, the voltage of the intermediate point 32 corresponds to an auxiliary voltage. Hereinafter, there is a case in which the voltage of the intermediate point 32 is described as the auxiliary voltage.

The auxiliary voltage is output to the application point 23 of the target circuit 20 through the connection wiring 33, and the voltage of the application point 23 is promptly raised to $V_{IN}/2$. That is, the voltage of the application point 23 is promptly raised to the output voltage $V_{OUT}$ (=$V_{IN}/2$) which is a voltage output by the target circuit 20.

As described above, the auxiliary circuit 20 outputs a voltage which is identical to the output voltage $V_{OUT}$ to the application point 23 as the auxiliary voltage, in accordance with a start-up timing of the target circuit 30. Accordingly, it is possible to sufficiently reduce a start-up time from the start of the target circuit 20 to a stationary operation.

In a case in which the output voltage $V_{OUT}$ reaches a proper voltage ($V_{IN}/2$), the target circuit 20 performs the stationary operation. That is, the capacitor portion 24 is charged, and the target circuit 20 outputs a constant output voltage $V_{OUT}$. The output voltage $V_{OUT}$ is input into the driving circuit 40, and the driving circuit 40 is driven.

In the state of the stationary operation, a minute stationary current according to the input voltage $V_{IN}$, and the synthetic impedance of the first MOS transistor 21a and the second MOS transistor 21b flows to the target circuit 20. On the other hand, in the auxiliary circuit 30, the stationary current is regulated by the first capacitor 31a, and thus, the auxiliary circuit 30 does not increase power consumption. Accordingly, it is possible to realize an extremely low-power consumption electric circuit which is driven by a minute current.

Figure 3A:
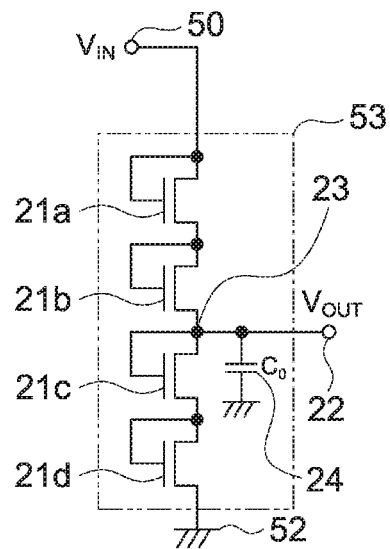
FIGS. 3A and 3B are circuits diagrams illustrating a comparative example of the electric circuit.
Figure 3B:
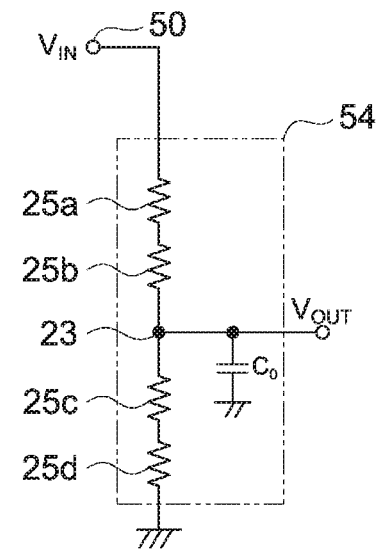
Figure 4:
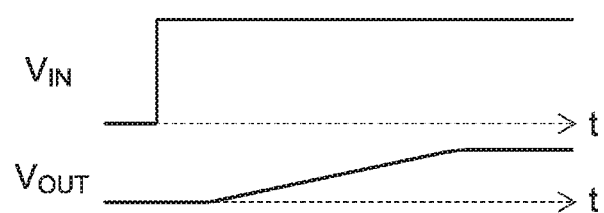
FIG. 4 is a schematic view for illustrating an operation waveform in the comparative example illustrated in FIGS. 3A and 3B.

FIGS. 3A and 3B are circuits diagrams illustrating a comparative example of the electric circuit. FIG. 4 is a schematic view for illustrating an operation waveform in the comparative example illustrated in FIGS. 3A and 3B.

FIG. 3A is a circuit diagram illustrating a configuration example of a voltage-dividing circuit 53 using the first MOS transistor 21a to the fourth MOS transistor 21d. The voltage-dividing circuit 53 illustrated in FIG. 3A has a configuration which is identical to that of the target circuit 20 illustrated in FIG. 1. FIG. 3B is a circuit diagram illustrating a configuration example of a voltage-dividing circuit 54 using a first resistance element 25a to a fourth resistance element 25d instead of the first MOS transistor 21a to the fourth MOS transistor 21d.

The first MOS transistor 21a and the second MOS transistor 21b illustrated in FIG. 3A have high impedance, and the synthetic impedance thereof is also high impedance. Accordingly, a current amount which flows into the application point 23 from the input point 50 through the first MOS transistor 21a and the second MOS transistor 21b is an extremely small value. For this reason, for example, it takes time to charge the capacitor portion 24 and to set the application point 23 to a proper voltage.

For example, as illustrated in FIG. 4, the value of the output voltage $V_{OUT}$ gradually increases after the input voltage $V_{IN}$ is input. In a case in which the value output voltage $V_{OUT}$ is a value in which the input voltage $V_{IN}$ is divided into ½, an increase in the output voltage $V_{OUT}$ is stopped, and the voltage-dividing circuit 53 performs the stationary operation. A time necessary for starting up the voltage-dividing circuit 53, for example, is a time according to a time constant depending on the impedance of the capacitor portion 24 and the voltage-dividing circuit 53.

In FIG. 3B, high-impedance resistance elements having properties identical to each other are used as the first resistance element 25a to the fourth resistance element 25b.

In this case, for example, a current amount which flows into the application point 23 from the input point 50 through the first resistance element 25a and the second resistance element 25b is an extremely small value. As a result thereof, as with the voltage-dividing circuit 53 illustrated in FIG. 3A, it takes time to perform the stationary operation from the start.

As described above, in the high-impedance circuit (the voltage-dividing circuit), the current for driving the circuit is reduced, and thus, there is a case in which it takes time to perform the stationary operation from the start of the circuit. As a result thereof, in an electric circuit including a high-impedance circuit, there is a possibility that the entire operation is delayed.

As described above, in the electric circuit 100 according to this embodiment, the voltage corresponding to the output power is applied to the application point 23 in the target circuit 20, and the output voltage $V_{OUT}$ is output from the output point 22 as the output power. The voltage corresponding to the output power is output to the application point 23 as the auxiliary voltage by the auxiliary circuit 30, and thus, it is possible to sufficiently reduce the time to perform the stationary operation from the start. Accordingly, it is possible to realize low power consumption.

A method of reducing a current flowing a circuit is considered as a method for realizing low power consumption of the circuit. In the method of reducing a circuit current, for example, a circuit having high-impedance properties is used. In such an extremely high-resistance (high-impedance) circuit, the circuit current is minute, and thus, there is a case in which it takes time to start up the circuit. For example, in the high-impedance circuit, a time constant according to the resistance and the capacitance (a stabilizing capacitance, a parasite capacitance, and the like) of the circuit increases. For this reason, there is a possibility that a start settling time from the start of the circuit to the settling increases.

In the electric circuit 100 according to this embodiment, a transient current (a high-frequency current) passing through the auxiliary circuit 30 flows into the application point 23 in accordance with the start-up timing of the target circuit 20. Accordingly, it is possible to promptly charge the capacitor portion 24 of the target circuit 20.

In addition, the auxiliary voltage is promptly raised by the low-impedance auxiliary circuit 30, and is output to the application point 23 of the target circuit 20, in accordance with the start-up timing of the target circuit 20. Accordingly, it is possible to set the voltage of the application point 23 of the target circuit 20 to promptly reach a proper voltage.

As described above, in this embodiment, a sufficient current and a sufficient voltage are promptly supplied to the application point 23 by the auxiliary circuit 30, in accordance with the start-up timing of the target circuit 20. Accordingly, it is possible to considerably reduce the start settling time of the target circuit 20. Accordingly, for example, even in an ultrahigh-impedance circuit in which an MOS transistor is operated in a subthreshold region, the start settling time is sufficiently reduced. As a result thereof, in various circuits, devices, systems, and the like, it is possible to realize both of extremely low power consumption and a reduction in the start settling time.

Second Embodiment

An electric circuit of a second embodiment according to the present technology will be described. In the following description, the description of configurations and functions identical to those of the electric circuit 100 described in the embodiment described above will be omitted or simplified.

Figure 5:
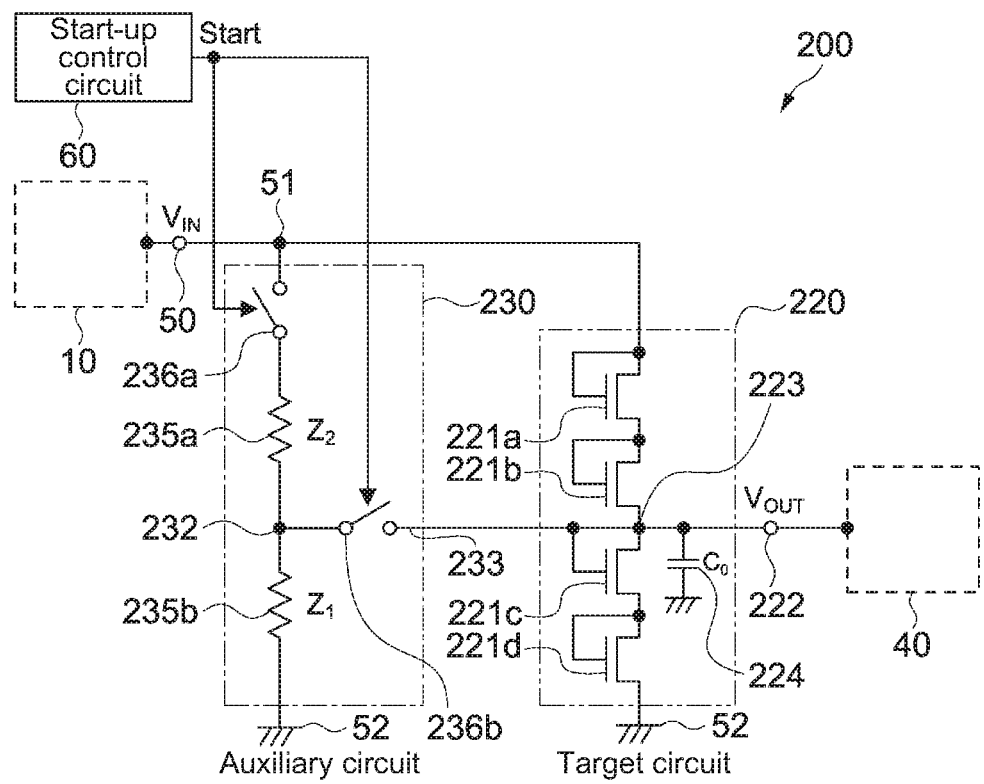
FIG. 5 is a circuit diagram illustrating a configuration example of an electric circuit according to a second embodiment.

FIG. 5 is a circuit diagram illustrating a configuration example of an electric circuit according to a second embodiment. An electric circuit 200 includes the power supply source 10, a target circuit 220, an auxiliary circuit 230, the driving circuit 40, and a start-up control circuit 60. In addition, the electric circuit 200 includes the input point 50, the branch point 51, and the ground point 52. Note that, the power supply source 10, the target circuit 220, and the driving circuit 40 of the electric circuit 200 illustrated in FIG. 5 have configurations which are respectively identical to the power supply source 10, the target circuit 20, and the driving circuit 40 of the electric circuit 100 illustrated in FIG. 1.

The power supply source 10 outputs the input voltage $V_{IN}$ to the input point 50. The input point 50 is connected to the branch point 51, and the branch point 51 is connected to each of the target circuit 220 and the auxiliary circuit 230.

The target circuit 220 has a configuration in which a first MOS transistor 221a to a fourth MOS transistor 221b are connected in series, and functions as a voltage-dividing circuit. The output voltage $V_{OUT}$ in which the input voltage $V_{IN}$ is divided into ½ is output from an output point 222 of the target circuit 220. The output voltage $V_{OUT}$ is input into the driving circuit 40, and the driving circuit 40 is driven.

The auxiliary circuit 30 includes a first resistance element 235a and a second resistance element 235b, an intermediate point 232, connection wiring 233, and a first switch element 236a and a second switch element 236b.

The first resistance element 235a is provided between the branch point 51 and the intermediate point 232. The second resistance element 235b is provided between the intermediate point 232 and the ground point 52. That is, the first resistance element 235a and the second resistance element 235b are connected in series between the branch point 232 and the ground point 52 through the intermediate point 232. The connection wiring 233 which is connected to the application point 223 of the target circuit 220 is connected to the intermediate point 232.

The value of the impedance of the first resistance element 235a is Z1, and the value of the impedance of the second resistance element 235b is Z2. In this embodiment, the impedance Z1 of the first resistance element 235a is set to be a value less than that of synthetic impedance of the first MOS transistor 221a and the second MOS transistor 221b. In addition, Z1 and Z2 are set to be approximately identical to each other (Z1=Z2). Note that, the value of the impedance of each of the resistance elements may be suitably set within a range in which the condition described above is satisfied, in accordance with the configuration, the type, and the like of the target circuit 220.

The first switch element 236a is provided between the branch point 51 and the first resistance element 235a. The second switch element S2 is provided between the intermediate point 232 and the application point 223, that is, on the connection wiring 233. A position in which the first switch element 236a and the second switch element 236b are provided, and the like are not limited. For example, the first switch element 236a or the second switch element 236b may be provided between the first resistance element 235a and the second resistance element 235b.

The first switch element 236a and the second switch element 236b switches ON/OFF of the path on the basis of a control signal which is output from the start-up control circuit 60 described below. In FIG. 5, an OFF state of each of the switch elements is schematically illustrated. For example, an analog switch circuit using an MOS transistor and the like is used as each of the switch elements. In addition, an arbitrary element which is capable of switching ON/OFF of the path may be used.

For example, in a case in which the first switch element 236a and the second switch element 236b are switched to ON, a path from the branch point 51 to the application point 223 of the target circuit 220 through the intermediate point 232 becomes conductive. That is, it is possible to pass a stationary current through the path from the branch point 51 to the application point 223. As a result thereof, the stationary current flows into the resistance circuit including the first resistance element 235a and the second resistance element 235b which are connected in series, and the value of the voltage (the auxiliary voltage) of the intermediate point 232 is a value in which the input voltage $V_{IN}$ is divided into ½.

Thus, a voltage-dividing circuit which performs voltage-dividing identical to that of the target circuit 220 is provided in the auxiliary circuit 230. In addition, in the auxiliary circuit 230, ON/OFF of the connection with respect to the power supply source 10 is switched by the first switch element 235a. In addition, ON/OFF of the connection with respect to the target circuit 220 (the application point 223) is switched by the second switch element 236b.

In the example illustrated in FIG. 5, a path from the branch point 51 to the application point 223 through the first switch element 236a, the first resistance element 235a, the intermediate point 232, the second switch element 236b, and the connection wiring 233 corresponds to the second wiring portion. In addition, the impedance Z1 of the first resistance element 235a corresponds to the second impedance.

The start-up control circuit 60 controls the switching of ON/OFF of the first switch element 236a and the second switch element 236b included in the auxiliary circuit 30. The start-up control circuit 60 outputs the control signal (in FIG. 5, represented as Start) for controlling each of the switch elements. The control signal is input into a control terminal (not illustrated) of each of the switch elements. In FIG. 5, the output of the control signal from the start-up control circuit 60 to each of the switch elements is schematically illustrated.

The control signal, for example, is a signal including a voltage corresponding to an ON state and a voltage corresponding to an OFF state. The switch element, for example, is controlled such that the switch is retained the ON state while the voltage corresponding to the ON state is output, and the switch is retained in the OFF state while the voltage corresponding to the OFF state is output. A method of controlling the switch element, and the like are not limited, and for example, arbitrary control according to the properties and the like of the target circuit 220 may be performed.

In this embodiment, a common control signal is output to the first switch element 236a and the second switch element 236b. That is, the start-up control circuit 60 performs the same control with respect to each of the switch elements at the same timing. Accordingly, ON/OFF of each of the switch elements is simultaneously switched. The present technology is not limited thereto, for example, ON/OFF of each of the switch elements may be individually switched.

In addition, in this embodiment, the first switch element 236a and the second switch element 236b are switched to ON by the start-up control circuit 60, in accordance with the time when the power supply source 10 outputs the input voltage $V_{IN}$. Then, the first switch element 236a and the second switch element 236b are switched to OFF after a predetermined time has elapsed from the time when the input voltage $V_{IN}$ is output. That is, a path through the auxiliary circuit 230 between the power supply source 10 and the application point 223 becomes conductive, and the path is cut off after a predetermined time has elapsed, in accordance with a start-up timing of the target circuit 220.

In this embodiment, the first switch element 236a, the second switch element 236b, and the start-up control circuit 60 cooperate with each other, and thus, function as a start-up switch portion.

Figure 6:
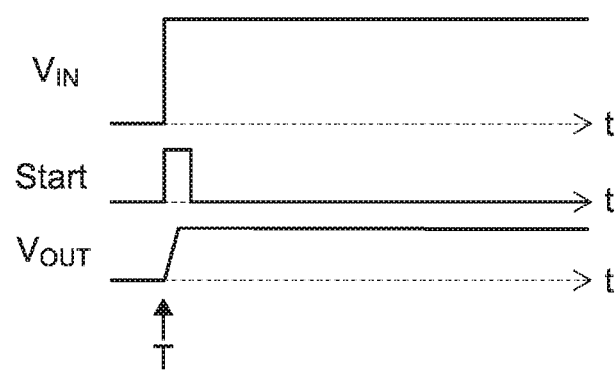
FIG. 6 is a schematic view for illustrating an operation waveform of the electric circuit illustrated in FIG. 5.

FIG. 6 is a schematic view for illustrating an operation waveform of the electric circuit 200 illustrated in FIG. 5. In FIG. 6, the waveform of the input voltage $V_{IN}$ which is output from the power supply unit 10, the waveform of the control signal (Start) which is output from the start-up control circuit 60, and the waveform of the output voltage $V_{OUT}$ which is output from the target circuit 220 are schematically illustrated along the time axis t.

The input voltage $V_{IN}$ is output at the time T by the power supply source 10. The control signal for setting the first switch element 236a and the second switch element 236b to be ON is output approximately simultaneously with the time T by the start-up control circuit 60. Each of the switch elements is simultaneously switched to ON on the basis of the control signal.

As described above, the impedance Z1 of the first resistance element 235a of the auxiliary circuit 230 is set to be a value less than that of the synthetic impedance of the first MOS transistor 221a and the second MOS transistor 221b of the target circuit 220. For this reason, a current amount flowing into the auxiliary circuit 230 is larger than a current amount flowing into the target circuit 220. The current flowing into the auxiliary circuit 230 from the branch point 51, flows into the application point 223 from the connection wiring 233 through the first switch element 236a, the first resistance element 235a, the intermediate point 232, and the second switch element 236b. Accordingly, the capacitor portion 224 of the target circuit 220 is promptly charged.

In addition, in the auxiliary circuit 230, the input voltage $V_{IN}$ is divided into ½, and the voltage of the intermediate point 232 (the auxiliary voltage) is promptly raised to $V_{IN}/2$. The auxiliary voltage is output to the application point 223 of the target circuit 220 through the connection wiring 233, and the voltage of the application point 223 is promptly raised to $V_{IN}/2$. That is, the voltage of the application point 223 is promptly raised to the output voltage $V_{OUT}$ ($=V_{IN}/2$) which is a voltage output by the target circuit 220.

As described above, the auxiliary circuit 230 outputs a voltage which is identical to the output voltage $V_{OUT}$ to the application point 223 as the auxiliary voltage, in accordance with the start-up timing of the target circuit 220. Accordingly, it is possible to sufficiently reduce a start-up time from the start of the target circuit 220 to the stationary operation.

The start-up control circuit 60 switches the first switch element 236a and the second switch element 236b to OFF after a predetermined time has elapsed from the start-up timing (the time T) of the target circuit 220. For this reason, there is no extra stationary current for driving the auxiliary circuit 230 flows, and power consumption does not increase.

Note that, a method of setting a predetermined time, and the like are not limited. For example, in a case in which a time set in advance has elapsed from the time T, the control signal for switching each of the switches to OFF may be output. In addition, for example, in a case in which the voltage of the output point 222 (the output voltage $V_{OUT}$) is greater than a threshold value set in advance, control of setting each of the switches to be OFF may be executed.

Thus, low-impedance auxiliary circuit 230 is connected to the high-impedance target circuit 220, in accordance with the start of the target circuit 220. Accordingly, when the target circuit 220 is started up, a current path to the application point 223 can be temporarily at low impedance. As a result thereof, the start-up time of the high-impedance target circuit 220 is sufficiently reduced, and it is possible to realize an extremely low-power consumption electric circuit 200 which is driven by a minute current.

In this embodiment, the connection between the target circuit 220 and the auxiliary circuit 230 is controlled by the start-up control circuit 60, and the first switch element 236a and the second switch element 236b. Accordingly, even in a case in which the stationary current flows the auxiliary circuit 230, each of the switch elements is controlled, and thus, power consumption of the auxiliary circuit 230 is suppressed, and it is possible to control the current amount flowing into the target circuit 220 with a high accuracy. Accordingly, it is possible to realize considerably low power consumption.

In addition, an arbitrary circuit through which the stationary current flows can be used as the auxiliary circuit 230, and thus, for example, it is possible to mount the auxiliary circuit 230 in accordance with the properties of the target circuit 220. As a result thereof, the degree of freedom of circuit design is dramatically improved, and it is possible to realize a low-power consumption circuit having various functions or applications.

Even in a case in which the target circuit has other configurations, the auxiliary circuit is provided, and thus, it is possible to improve the start-up time of the target circuit, and the like. In addition, it is also possible to arbitrarily set the configuration of the auxiliary circuit. Hereinafter, an electric circuit in which the target circuit and the auxiliary circuit having various configurations are combined will be described.

FIG. 7 to FIG. 10 are circuit diagrams illustrating an example in which the target circuit is a voltage-dividing circuit using a resistance element. In FIG. 7 to FIG. 10, for ease of the description, the power supply source 10 and the driving circuit 40 described in FIG. 1 and FIG. 5 are omitted.

Figure 7:
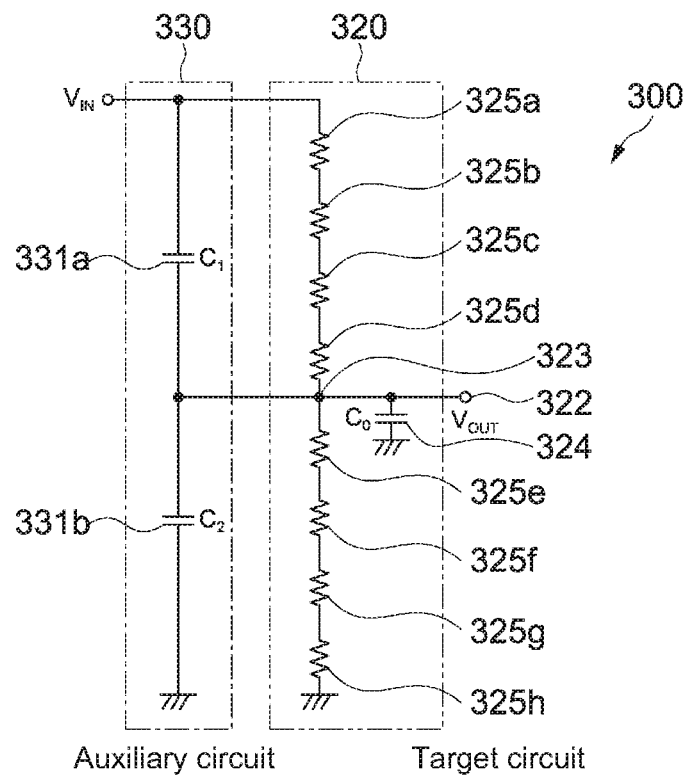
FIG. 7 is a circuit diagram illustrating an example in which a target circuit is a voltage-dividing circuit using a resistance element.

In an electric circuit 300 illustrated in FIG. 7, a voltage-dividing circuit (a target circuit 320) in which a first resistance element 325a to an eighth resistance element 325h are connected in series in this order is used instead of the target circuit 20 illustrated in FIG. 1. The resistance elements are high-impedance resistance elements having properties identical to each other. The value of the impedance and the like of each of the resistance elements included in the target circuit 320 are not limited, and for example, arbitrary impedance which is capable of outputting a desired output voltage $V_{OUT}$ may be suitably set.

In the target circuit 320, a voltage between a fourth resistance element 325d and a fifth resistance element 325e is output from an output point 322 as the output voltage $V_{OUT}$. Accordingly, the target circuit 320 functions as a voltage-dividing circuit which divides the input voltage $V_{IN}$ into ½. Note that, an application point 323 is provided between the fourth resistance element 325d and the fifth resistance element 325e.

An auxiliary circuit 330 included in the electric circuit 300 has a configuration which is identical to that of the auxiliary circuit 30 illustrated in FIG. 1. That is, the auxiliary circuit 330 is the voltage-dividing circuit which divides the input voltage $V_{IN}$ into ½ by a first capacitor 331a and a second capacitor 331b. Electric capacitances C1 and C2 of the first capacitor 331a and the second capacitor 331b are set to be a value greater than that of the electric capacitance C0 of a capacitor portion 324 of the target circuit 320. In addition, the impedance of each of the capacitors with respect to a high-frequency current is a value less than that of synthetic impedance of the first resistance element 325a to the fourth resistance element 325d.

In order to start up the target circuit 320, the input voltage $V_{IN}$ is input into the target circuit 320 and the auxiliary circuit 330. A high-frequency current included in the rise of the input voltage $V_{IN}$ passes through the first capacitor 331a, and flows into the application point 323 of the target circuit 320, and thus, the capacitor portion 324 is charged.

In addition, in the auxiliary circuit 330, the input voltage $V_{IN}$ is divided into ½, and thus, the auxiliary voltage is generated. The auxiliary voltage is output to the application point 323, and the voltage of the application point 323 (the output point 322) is promptly raised to $V_{IN}/2$. Accordingly, it is possible to sufficiently reduce a start-up time of the target circuit 320.

Figure 8:
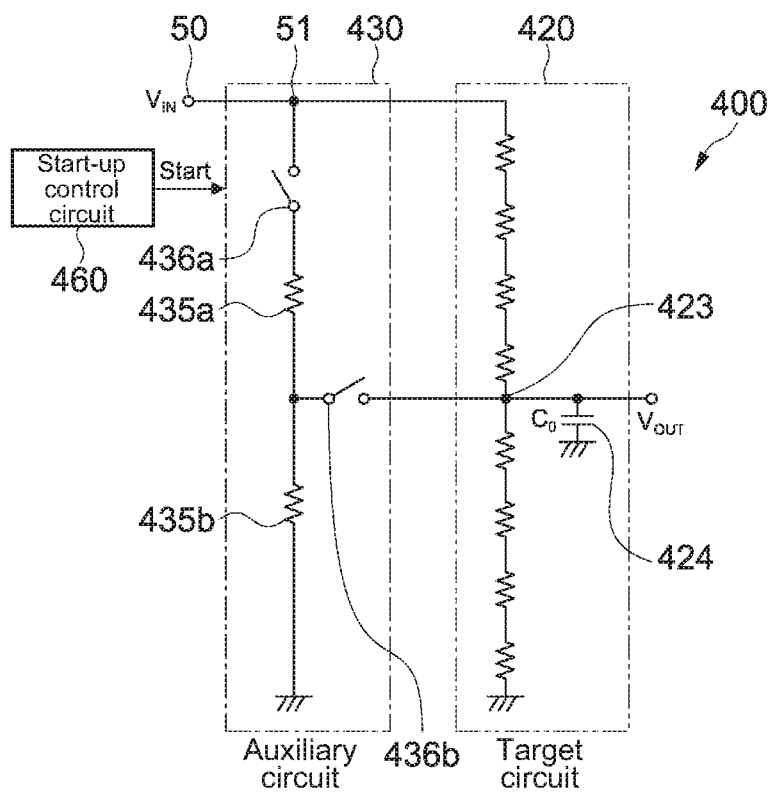
FIG. 8 is a circuit diagram illustrating an example in which the target circuit is the voltage-dividing circuit using the resistance element.

In an electric circuit 400 illustrated in FIG. 8, a target circuit 420 having a configuration which is identical to that of the voltage-dividing circuit (the target circuit 320) using the resistance element illustrated in FIG. 7 is used instead of the target circuit 220 illustrated in FIG. 5. Accordingly, the target circuit 420 functions as the voltage-dividing circuit which divides the input voltage $V_{IN}$ into ½.

An auxiliary circuit 430 includes a voltage-dividing circuit in which a first resistance element 435a and a second resistance element 435b are connected in series, and divides the input voltage $V_{IN}$ into ½, and thus, generates the auxiliary voltage. The impedance of the first resistance element 435a is set to be lower than the impedance of a path through the target circuit 420 between the branch point 51 and an application point 423.

In the auxiliary circuit 430, a current and the like which are input into the auxiliary circuit 430 are controlled by a first switch element 436a. In addition, connection between the auxiliary circuit 430 and the target circuit 420 is controlled by a second switch element 436b. The control of ON/OFF of the first switch element 436a and the second switch element 436b is executed on the basis of a control signal (Start) which is output from the start-up control circuit 460.

The first switch element 436a and the second switch element 436b are switched to ON in accordance with a timing when the input voltage $V_{IN}$ is input into the input point 50 (a start-up timing of the target circuit 420). A current passing through the first switch element 436a, the first resistance element 435a, and the second switch element 436b flows into the application point 423 of the target circuit, and thus, the capacitor portion 424 is charged.

In addition, in the auxiliary circuit 430, the input voltage $V_{IN}$ is divided into ½, and thus, the auxiliary voltage is generated. The auxiliary voltage is output to the application point 423, and the voltage of the application point 423 is promptly raised to $V_{IN}/2$. Accordingly, it is possible to sufficiently reduce the start-up time of the target circuit 420. Note that, the first switch element 436a and the second switch element 436b are switched to OFF after a predetermined time has elapsed.

Figure 9:
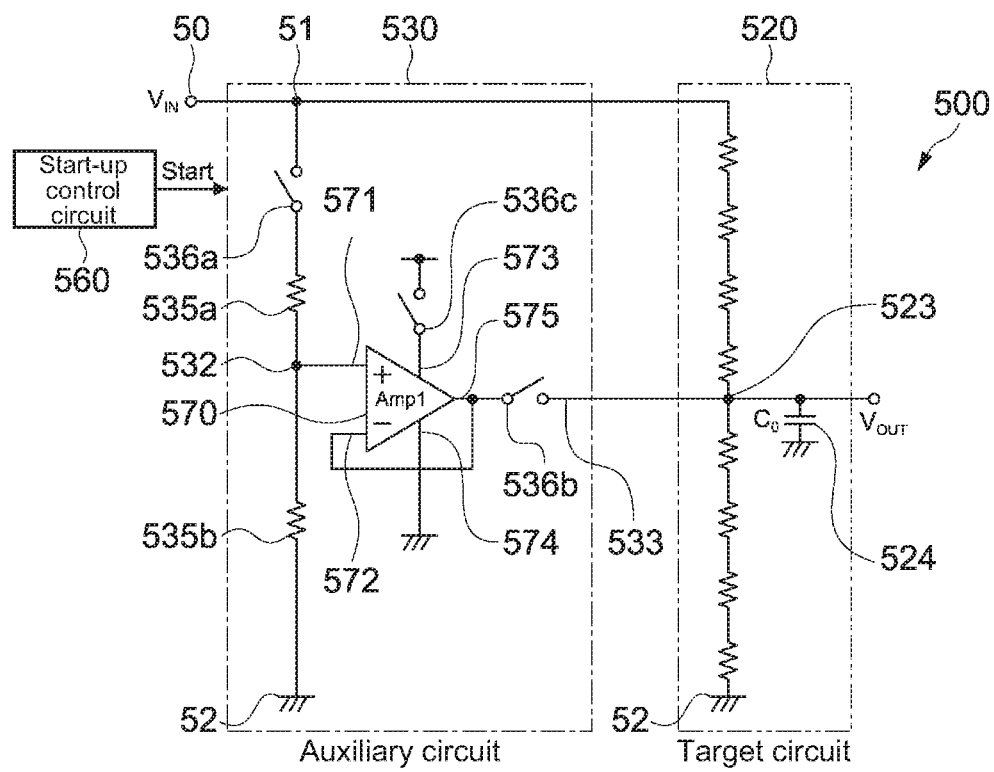
FIG. 9 is a circuit diagram illustrating an example in which the target circuit is the voltage-dividing circuit using the resistance element.

An electric circuit 500 illustrated in FIG. 9 includes a target circuit 520, an auxiliary circuit 530, and a start-up control circuit 560. The target circuit 520 has a configuration which is identical to that of the target circuit 320 and the target circuit 420 illustrated in FIG. 7 and FIG. 8. That is, the target circuit 520 functions as the voltage-dividing circuit which divides the input voltage $V_{IN}$ into ½.

The auxiliary circuit 530 includes a first resistance element 535a and a second resistance element 535b, an intermediate point 532, an amplifier element 570, a first switch element 536a to a third switch element 536c, and connection wiring 533.

The first resistance element 535a is provided between the branch point 51 and the intermediate point 532. The second resistance element 535b is provided between the intermediate point 532 and the ground point 52. The impedance of the first resistance element 535a and the impedance of the second resistance element 536b are set to be values identical to each other. Accordingly, the voltage-dividing circuit which divides the input voltage $V_{IN}$ into ½ is configured by each of the resistance elements.

The amplifier element 570 includes a non-inversion input terminal 571, an inversion input terminal 572, a positive side power source terminal 573, a negative side power source terminal 574, and an output terminal 575. The non-inversion input terminal 571 is connected to the intermediate point 532. The inversion input terminal 572 is short-circuited to the output terminal 575. The positive side power source terminal 573 is connected to a predetermined power source. The negative side power source terminal 574 is connected to GND. The output terminal 575 is connected to an application point 533 of the target circuit 520 through the connection wiring 533.

The amplifier element 570 has a voltage follower configuration in which the output terminal 575 and the inversion input terminal 572 are short-circuited. Accordingly, a voltage identical to the voltage which is input into the non-inversion input terminal 571 is output from the output terminal 575. That is, the voltage of the intermediate point 532 is output from the output terminal 575 of the amplifier element 570.

Output impedance of the amplifier element 570 is set to be lower than the impedance of a path through the target circuit 520 from the branch point 51 to the application point 523. A general amplification circuit and the like which are mounted on an operational amplifier and the like are used as the amplifier element 570. Note that, the type, the configuration, and the like of the amplifier element 570 are not limited, and for example, the configuration, and the like of the amplifier element 570 may be suitably set in accordance with the properties of the target circuit 520. In the example illustrated in FIG. 9, a replica circuit which outputs the auxiliary voltage is configured by the first resistance element 535a and the second resistance element 536b, and the amplifier element 570.

The first switch element 536a is provided between the branch point 51 and the first resistance element 535a. The second switch element 536b is provided between the output terminal 575 of the amplifier element 570 and the application point 523 of the target circuit 520, that is, on the connection wiring 533. The third switch element 536c is provided between the positive side power source terminal 573 of the amplifier element 570 and a predetermined power source.

The control of ON/OFF of the first switch element 536a to the third switch element 536c is executed on the basis of a control signal (Start) which is output from the start-up control circuit 560.

The first switch element 536a to the third switch element 536c are switched to ON in accordance with a timing when the input voltage $V_{IN}$ is input into the input point 50. The input voltage $V_{IN}$ is divided into ½ by the first resistance element 535a and the second resistance element 535b, and is input into the non-inversion input terminal 571 of the amplifier element 570.

In the amplifier element 570, a voltage in which the input voltage $V_{IN}$ is divided into ½ is generated as the auxiliary voltage. The auxiliary voltage is output to the application point 523 of the target circuit 520 from the output terminal 575 through the connection wiring 533. In addition, a sufficient current flows into the application point 523 from the amplifier element 570 (the output terminal 575) having low output impedance, and the capacitor portion 524 is charged. As a result thereof, the voltage of the application point 523 is promptly raised to $V_{IN}/2$. Accordingly, it is possible to sufficiently reduce a start-up time of the target circuit 520.

Note that, the first switch element 536a to the third switch element 536c are switched to OFF after a predetermined time has elapsed. Accordingly, a current flowing the first resistance element 535a and the second resistance element 535b, or power supply with respect to the amplifier element 570 is cut, and thus, power consumption does not increase. The amplifier element 570 is used, and thus, for example, even in a case in which a load according to the start of the target circuit 520 is large, it is possible to supply a sufficient current and a sufficient voltage to the application point 523. Accordingly, it is possible to reduce a start-up time of various target circuits.

Figure 10:
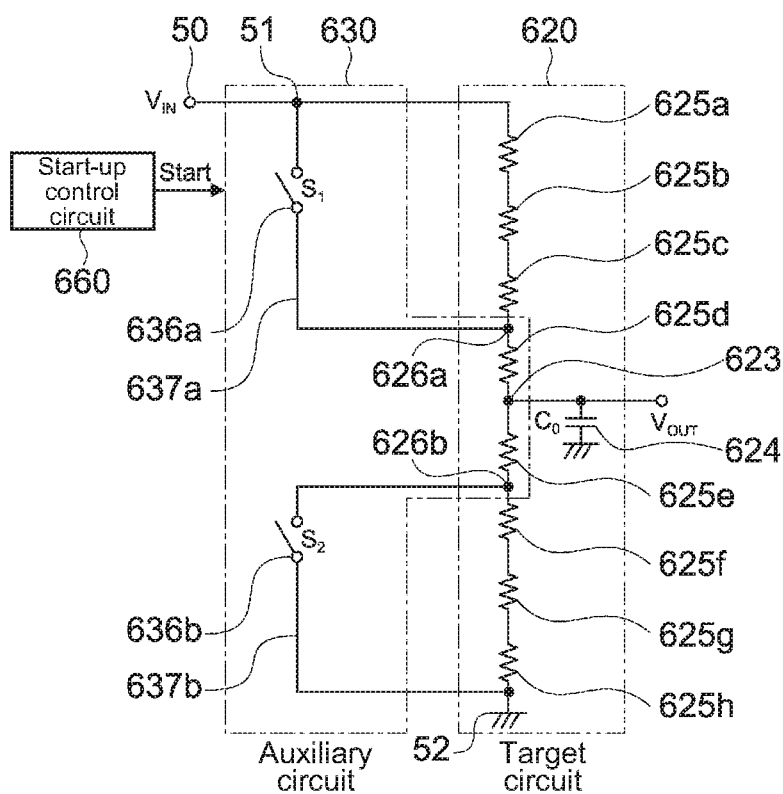
FIG. 10 is a circuit diagram illustrating an example in which the target circuit is the voltage-dividing circuit using the resistance element.

An electric circuit 600 illustrated in FIG. 10 includes a target circuit 620, an auxiliary circuit 630, and a start-up control circuit 660.

The target circuit 620 includes a first resistance element 625a to an eighth resistance element 625h, a first connection point 626a and a second connection point 626b, an application point 623, and a capacitor portion 624. The target circuit 620 is a voltage-dividing circuit in which the first resistance element 625a to the eighth resistance element 625h are connected in series in this order.

The resistance elements excluding the fourth resistance element 625d and the fifth resistance element 625e from each of the resistance elements are high-impedance resistance elements having properties identical to each other. The fourth resistance element 625d and the fifth resistance element 625e are low-impedance resistance elements having properties identical to each other.

In the target circuit 620, a voltage between the fourth resistance element 625d and the fifth resistance element 625e is output as the output voltage $V_{OUT}$. Accordingly, the target circuit 620 functions as the voltage-dividing circuit which divides the input voltage $V_{IN}$ into ½.

As illustrated in FIG. 10, the first connection point 626a is provided between the third resistance element 625c and the fourth resistance element 625d. In addition, the second connection point 626b is provided between the fifth resistance element 625e and the sixth resistance element 625f. In addition, the application point 623 is provided between the fourth resistance element 625d and the fifth resistance element 625e.

The auxiliary circuit 630 includes first connection wiring 637a and second connection wiring 637b, and a first switch element 636a and a second switch element 636b.

The first connection wiring 637a is wiring which connects the branch point 51 and the first connection point 626a of the target circuit 620 to each other. That is, the first connection wiring 637a is wiring which short-circuits the path of the target circuit 620 passing through the first resistance element 625a to the third resistance element 625c. The second connection wiring 637b is wiring which connects the ground point 52, and the second connection point 626b of the target circuit 620 to each other. That is, the second connection wiring 637b is wiring which short-circuits the path of the target circuit 620 passing through the sixth resistance element 625f to the eighth resistance element 625h.

The first switch element 636a is provided on the first connection wiring 637a, and the second switch element 636b is provided on the second connection wiring 637b. The control of ON/OFF of each of the switch elements is executed on the basis of a control signal (Start) which is output from the start-up control circuit 660.

In the electric circuit 600 illustrated in FIG. 10, a path from the branch point 51 to the application point 623 the first resistance element 625a and to the fourth resistance element 625d corresponds to the first wiring portion. In addition, a path from the branch point 51 to the application point 623 through the first connection wiring 637a, the first switch element 636a, the first connection point 626a, and the fourth resistance element 625d corresponds to the second wiring portion.

Accordingly, a path from the first connection point 626a to the application point 623 is a common wiring portion which is wiring common to each of the first wiring portion and the second wiring portion. In addition, the first resistance element 625a to the third resistance element 625c correspond to wiring of the first wiring portion, different from the common wiring portion. Then, the first connection wiring 637a corresponds to wiring of the second wiring portion in which a start-up switch portion is provided, the wiring being different from the common wiring portion.

The first switch element 636a and the second switch element 636b are switched to ON in accordance with a timing when the input voltage $V_{IN}$ is input into the input point 50. As a result thereof, the potential of the first connection point 626a is a potential which is identical to that of the input point 50 (the branch point 51). In addition, the potential of the second connection point 626b is a potential which is identical to that of GND. That is, the input voltage $V_{IN}$ is applied to both ends of the fourth resistance element 625d and the fifth resistance element 625e.

The fourth resistance element 625d has low impedance, and thus, a sufficient current flows into the application point 623, and the capacitor portion 624 is promptly charged. In addition, the voltage of the application point 623 is raised to a voltage of $V_{IN}/2$ by the fourth resistance element 625d and the fifth resistance element 625e. Accordingly, it is possible to sufficiently reduce a start-up time of the target circuit 620.

Note that, the first switch element 636a and the second switch element 636b are switched to OFF after a predetermined time has elapsed, and the target circuit 620 performs the stationary operation. Thus, a part of the target circuit 620 is used as wiring common to the auxiliary circuit 630, and thus, it is possible to decrease the area of the circuit, and it is possible to downsize the circuit.

In FIG. 10, a part of the path of the target circuit 620 is temporarily short-circuited by the first connection wiring 637a and the second connection wiring 637b. Thus, another path is temporarily prepared, and thus, a function of decreasing the impedance of the target circuit 620 is exhibited. For example, even in a case in which the first resistance element 625a and to the fourth resistance element 625d have the same impedance, it is possible to exhibit the same effect of short-circuiting a part of the path by the first connection wiring 637a.

FIG. 11 to FIG. 15 are circuit diagrams illustrating an example in which the target circuit is a voltage-dividing circuit using an MOS transistor resistance. In the voltage-dividing circuit (the target circuit) illustrated in FIG. 11 to FIG. 15, diode-connected MOS transistors are used.

Figure 11:
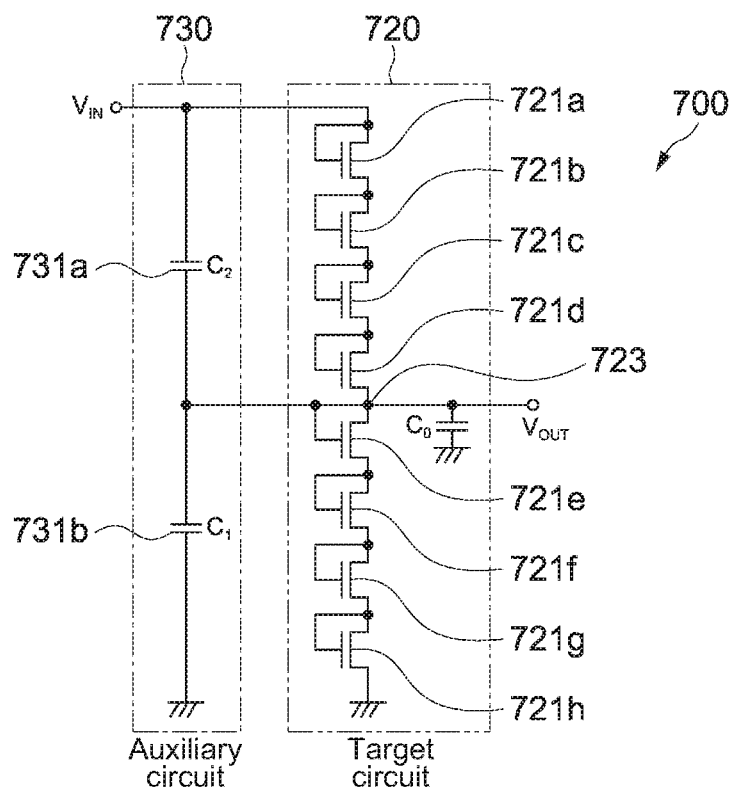
FIG. 11 is a circuit diagram illustrating an example in which the target circuit is a voltage-dividing circuit using an MOS transistor resistance.

In an electric circuit 700 illustrated in FIG. 11, a voltage-dividing circuit (a target circuit 720) in which a first MOS transistor 721a to an eighth MOS transistor 721h are connected in series in this order is used instead of the target circuit 20 illustrated in FIG. 1. The respective MOS transistors have properties identical to each other, and function as a high-impedance resistance element. The value of the impedance and the like of each of the MOS transistors included in the target circuit 720 are not limited, and for example, arbitrary impedance which is capable of outputting a desired output voltage $V_{OUT}$ may be suitably set.

In the target circuit 720, a voltage between a fourth MOS transistor 721d and a fifth MOS transistor 721e is output as the output voltage $V_{OUT}$. Accordingly, the target circuit 720 functions as the voltage-dividing circuit which divides the input voltage $V_{IN}$ into ½. Note that, an application point 723 is provided between the fourth resistance transistor 721d and the fifth resistance transistor 721e.

An auxiliary circuit 730 has a configuration which is identical to that of the auxiliary circuit 30 illustrated in FIG. 1, and functions as the voltage-dividing circuit which divides the input voltage $V_{IN}$ into ½ by a first capacitor 731a and a second capacitor 731b.

The input voltage $V_{IN}$ is input into the target circuit 720 and the auxiliary circuit 730. The auxiliary circuit 730 generates the auxiliary voltage ($V_{IN}/2$), and outputs the auxiliary voltage to the application point 723 of the target circuit 720. Accordingly, the output voltage $V_{OUT}$ of the target circuit 720 is promptly raised, and it is possible to sufficiently reduce a start-up time of the target circuit 720.

Figure 12:
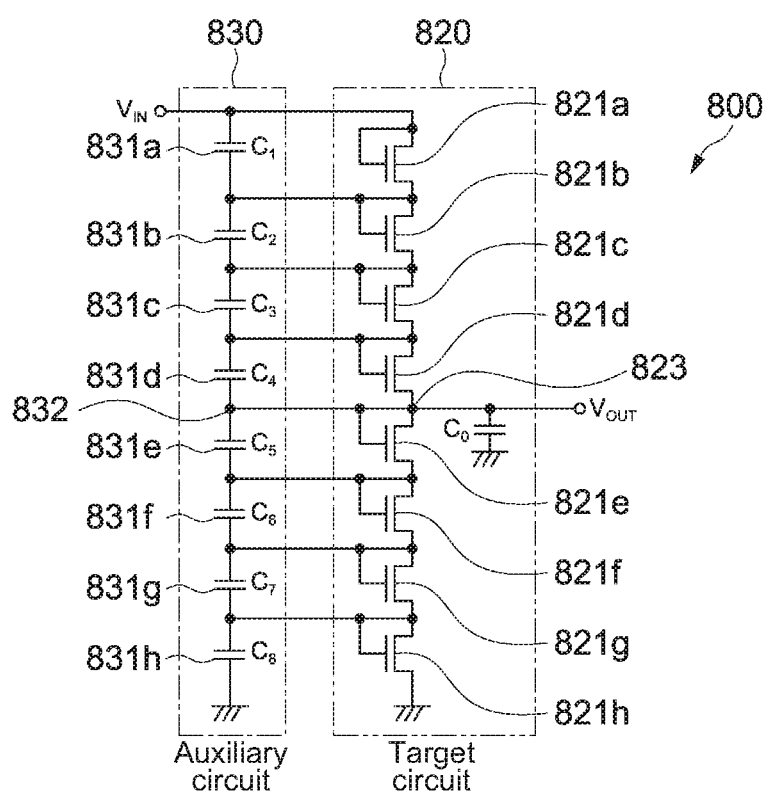
FIG. 12 is a circuit diagram illustrating an example in which the target circuit is the voltage-dividing circuit using the MOS transistor resistance.

In an electric circuit 800 illustrated in FIG. 12, a voltage-dividing circuit (an auxiliary circuit 830) in which a first capacitor 831a to an eighth capacitor 831h are connected in series in this order is used instead of the auxiliary circuit 730 illustrated in FIG. 11. Electric capacitances C1 to C8 of the first capacitor 831a to the eighth capacitor 831h are set to values equal to each other. Accordingly, the auxiliary circuit 830 functions as a voltage-dividing circuit which performs voltage-dividing with respect to the input voltage $V_{IN}$ by eight capacitors of which electric capacitances are approximately identical to each other. As a result thereof, the voltage on both ends of each of the capacitors are a value in which the input voltage $V_{IN}$ is divided into ⅛.

In the auxiliary circuit 830, the first capacitor 831a is connected to the first MOS transistor 821a such that the voltages on both ends of the first capacitor 831a is a voltage between a drain and a source of the first MOS transistor 821a. Similarly, the second capacitor 831b to the eighth capacitor 831h are also respectively connected to the second MOS transistor 821b to the eighth MOS transistor 821h. Note that, an intermediate point 832 is provided between the fourth capacitor 831d and the fifth capacitor 831e, and the intermediate point 832 is connected to an application point 823 of the target circuit 820.

The input voltage $V_{IN}$ is input into the target circuit 820 and the auxiliary circuit 830. The voltages ($V_{IN}/8$) on both ends of the corresponding capacitor are applied to the respective MOS transistors. Accordingly, each of the MOS transistors is promptly started up. In addition, in the intermediate point 832, the auxiliary voltage ($V_{IN}/2$) is generated, and is output to the application point 823 of the target circuit 820. Accordingly, the output voltage $V_{OUT}$ of the target circuit 820 is promptly raised, and it is possible to sufficiently reduce a start-up time of the target circuit 820.

Figure 13:
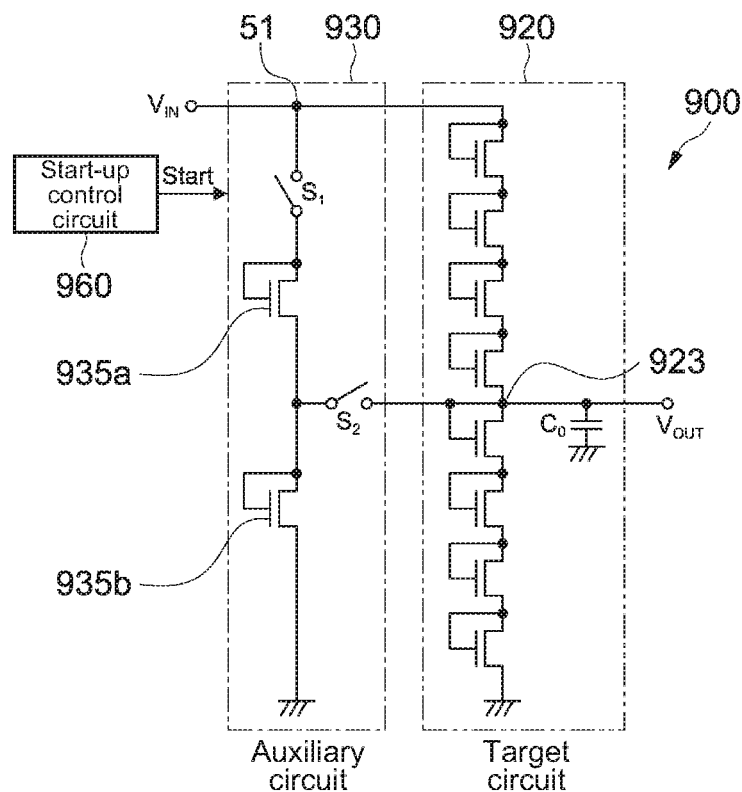
FIG. 13 is a circuit diagram illustrating an example in which the target circuit is the voltage-dividing circuit using the MOS transistor resistance.

In an electric circuit 900 illustrated in FIG. 13, a target circuit 920 having a configuration which is identical to that of the voltage-dividing circuit (the target circuit 720) using the MOS transistor illustrated in FIG. 11 is used instead of the target circuit 220 illustrated in FIG. 5. In addition, an auxiliary circuit 930 is a voltage-dividing circuit in which the first resistance element 235a and the second resistance element 235b of the auxiliary circuit 230 illustrated in FIG. 5 are changed to a ninth MOS transistor 935a and a tenth MOS transistor 935b.

The impedance of the ninth MOS transistor 935a is set to be lower than the impedance of a path through the target circuit 920 from the branch point 51 to the application point 923. In addition, the ninth MOS transistor 935a and the tenth MOS transistor 935b have properties identical to each other. Accordingly, the auxiliary circuit 930 functions as the voltage-dividing circuit which divides the input voltage $V_{IN}$ into ½.

Each of the switch elements of the auxiliary circuit 930 is switched to ON by a start-up control circuit 960, in accordance with a timing when the input voltage $V_{IN}$ is input. The auxiliary circuit 930 generates the auxiliary voltage ($V_{IN}/2$), and outputs the auxiliary voltage to an application point 923 of the target circuit 920. Accordingly, the output voltage $V_{OUT}$ of the target circuit 920 is promptly raised, and it is possible to sufficiently reduce a start-up time of the target circuit 920. Note that, each of the switch elements is switched to OFF by the start-up control circuit 960 after a predetermined time has elapsed. Accordingly, it is possible to suppress power consumption of the auxiliary circuit 930, and low power consumption of the electric circuit 900 is realized.

Figure 14:
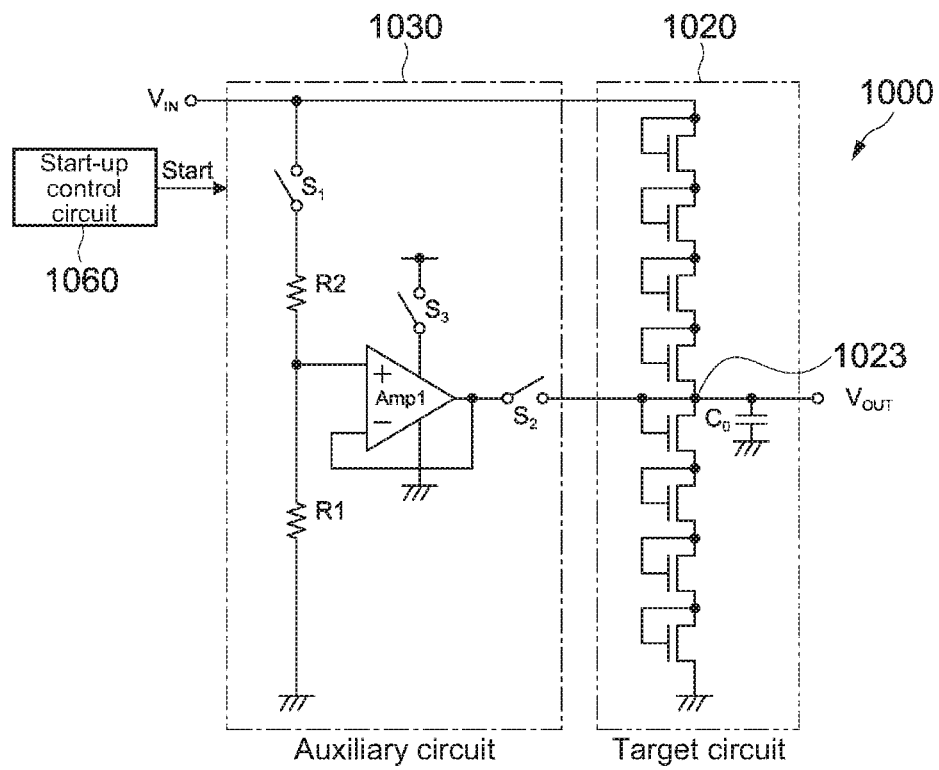
FIG. 14 is a circuit diagram illustrating an example in which the target circuit is the voltage-dividing circuit using the MOS transistor resistance.

An electric circuit 1000 illustrated in FIG. 14 includes a target circuit 1020, an auxiliary circuit 1030, and a start-up control circuit 1060. The target circuit 1020 has a configuration which is identical to that of the target circuit 720 illustrated in FIG. 11, and functions as the voltage-dividing circuit which divides the input voltage $V_{IN}$ into ½. The auxiliary circuit 1030 has a configuration which is identical to that of the auxiliary circuit 530 illustrated in FIG. 9, and functions as the replica circuit which outputs the auxiliary voltage ($V_{IN}/2$).

Each of the switch elements of the auxiliary circuit 1030 is switched to ON by the start-up control circuit 1060, in accordance with a timing when the input voltage $V_{IN}$ is input. The auxiliary circuit 1030 generates the auxiliary voltage ($V_{IN}/2$), and outputs the auxiliary voltage to an application point 1023 of the target circuit 1020. Accordingly, the output voltage $V_{OUT}$ of the target circuit 1020 is promptly raised, and it is possible to sufficiently reduce a start-up time of the target circuit 1020. In addition, in a case in which a predetermined time has elapsed, each of the switch elements is switched to OFF. Accordingly, it is possible to realize low power consumption without increasing power consumption of the auxiliary circuit 1030.

Figure 15:
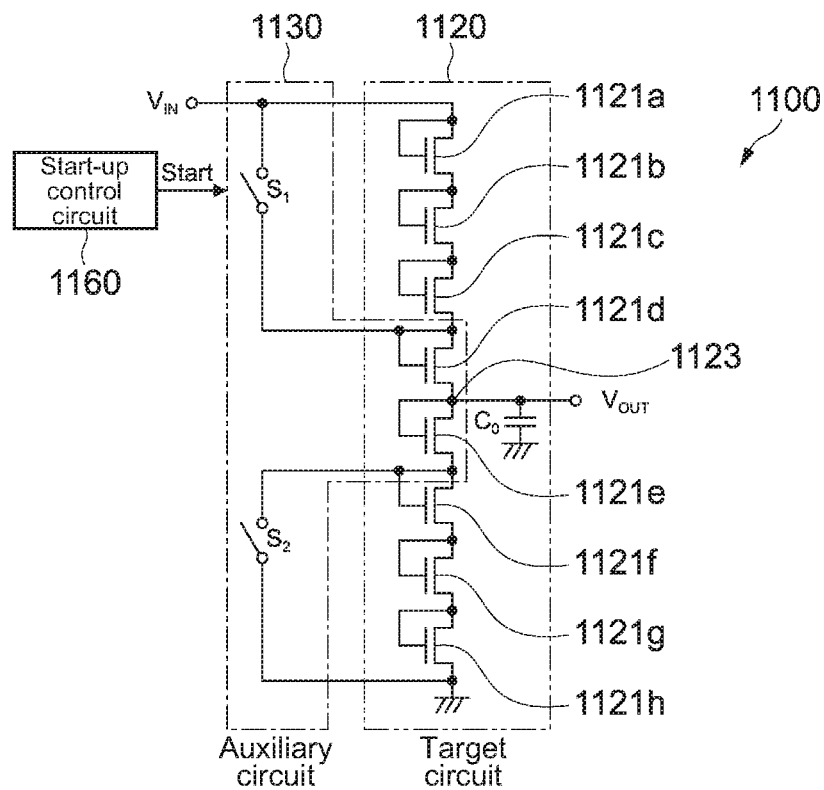
FIG. 15 is a circuit diagram illustrating an example in which the target circuit is the voltage-dividing circuit using the MOS transistor resistance.

An electric circuit 1100 illustrated in FIG. 15 includes a target circuit 1120, an auxiliary circuit 1130, and a start-up control circuit 1160. The target circuit 1120 is a voltage-dividing circuit in which the first resistance element 625a to the eighth resistance element 625h of the target circuit 620 illustrated in FIG. 10 are respectively changed to a first MOS transistor 1121a to an eighth MOS transistor 1121h.

MOS transistors excluding the fourth MOS transistor 1121d and the fifth MOS transistor 1121e from the MOS transistors have properties identical to each other, and function as a high-impedance resistance element. The fourth MOS transistor 1121d and the fifth MOS transistor 1121e have properties identical to each other, and have impedance which is set to be lower than that of the other MOS transistors.

The auxiliary circuit 1130 has a configuration which is identical to that of the auxiliary circuit 630 illustrated in FIG. 10. That is, the auxiliary circuit 630 functions as a circuit which short-circuits each of a path through the first MOS transistor 1121a to the third MOS transistor 1121c and a path through the sixth MOS transistor 1121f to the eighth MOS transistor 1121h.

Each of the switch elements of the auxiliary circuit 1130 is switched to ON by the start-up control circuit 1160, in accordance with a timing when the input voltage $V_{IN}$ is input. As a result thereof, the input voltage $V_{IN}$ is divided by the fourth MOS transistor 1121d and the fifth MOS transistor 1121e, and the voltage of the application point 1123 is raised to $V_{IN}/2$. Accordingly, the output voltage $V_{OUT}$ of the target circuit 1120 is promptly raised, and it is possible to sufficiently reduce a start-up time of the target circuit 1120. In addition, in a case in which a predetermined time has elapsed, each of the switch elements is switched to OFF. Accordingly, it is possible to realize low power consumption without increasing power consumption of the auxiliary circuit 1130.

Note that, a high impedance value which is identical to that of the other MOS transistors may be set as the impedance of the fourth MOS transistor 1121d and the fifth MOS transistor 1121e. In addition, resistance elements may be respectively used instead of the fourth MOS transistor 1121d and the fifth MOS transistor 1121e. In addition, the type and the like of the resistance element which is used in the voltage-dividing circuit (the target circuit 1120) are not limited, and the voltage-dividing circuit may be configured by suitably combining an MOS transistor, a general resistance element, and the like.

Figure 16:
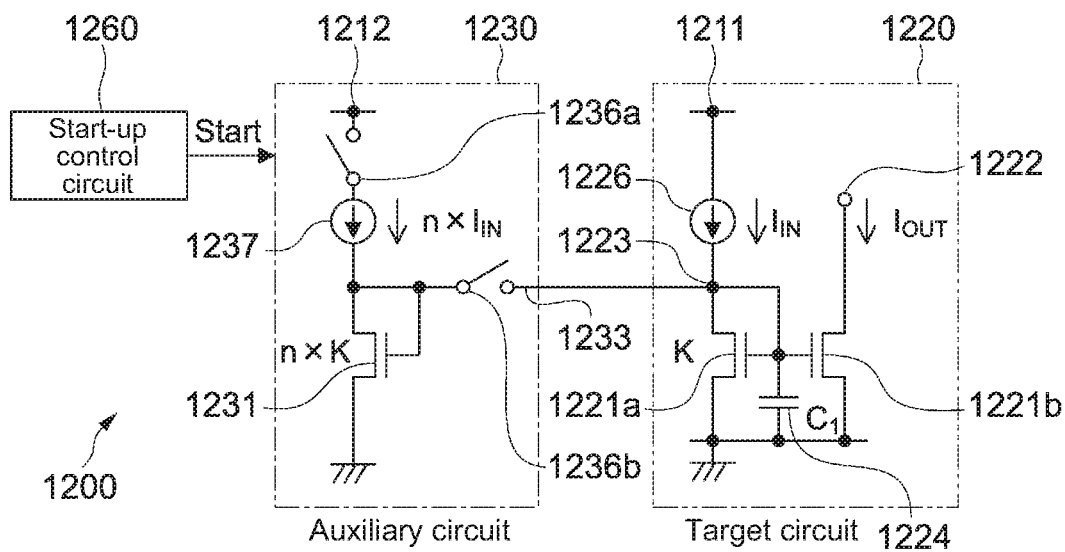
FIG. 16 is a circuit diagram illustrating an example in which the target circuit is a constant current circuit.
Figure 17:
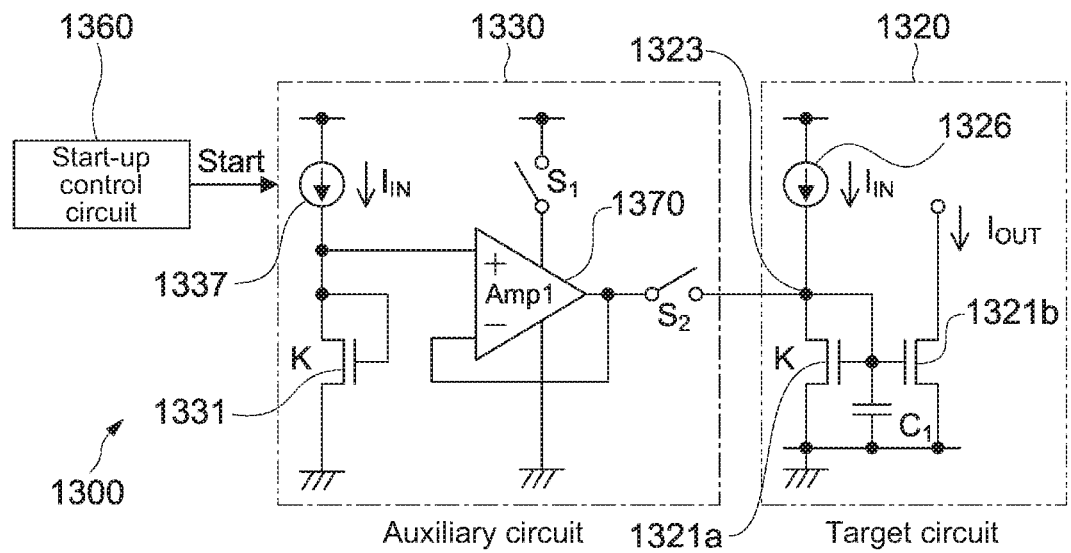
FIG. 17 is a circuit diagram illustrating an example in which the target circuit is the constant current circuit.

FIG. 16 and FIG. 17 are circuit diagrams illustrating an example in which the target circuit is a constant current circuit.

An electric circuit 1200 illustrated in FIG. 16 includes a target circuit 1220, an auxiliary circuit 1230, and a start-up control circuit 1260. In addition, the electric circuit 1200 includes a first power supply source 1211 and a second power supply source 1212.

The target circuit 1220 includes a first current generation unit 1226, a first MOS transistor 1221a and a second MOS transistor 1221b, a capacitor portion 1224, an application point 1223, and an output point 1222. The first current generation unit 1226 is connected to the first power supply source 1211, and generates the input current $I_{IN}$.

A drain of the first MOS transistor 1221a is connected to the first current generation unit 1226, and a source is connected to GND. A drain of the second MOS transistor 1221b is connected to the output point 1222, and a source is connected to GND. In addition, gates of the respective MOS transistors are connected to each other, and are short-circuited to the drain of the first MOS transistor.

The first MOS transistor 1221a and the second MOS transistor 1221b have properties identical to each other. Accordingly, a current mirror circuit which outputs the output current $I_{OUT}$ identical to the input current $I_{IN}$ from the output point 1223 is configured. In FIG. 16, an MOS transistor of which a conductance coefficient is K is used as each of the MOS transistors. The conductance coefficient, for example, is a parameter which is set by the gate width W and the gate length L, and is proportionate to W/L.

The capacitor portion 1224 is provided between the respective gates which are short-circuited and GND. The application point 1223 is provided between the first current generation unit 1226a and the first MOS transistor 1221a. An arbitrary load such as a driving circuit is connected to the output point 1222.

The auxiliary circuit 1230 includes a second current generation unit 1237, a third MOS transistor 1231, a first switch element 1236a and a second switch element 1236b, and connection wiring 1233. The second current generation unit 1237 is connected to the second power supply source 1212, and generates the auxiliary current. In FIG. 16, $n \times I_{IN}$ is generated as the auxiliary current.

A drain of the third MOS transistor 1231 is connected to the second current generation unit 1237, a source is connected to GND, and a gate is short-circuited to the drain. In addition, the gate (the drain) of the third MOS transistor 1231 is connected to the application point 1223 of the target circuit 1220 through the connection wiring 1233. A conductance coefficient of the third MOS transistor 1231 is set to $n \times K$. For example, an MOS transistor of which the gate width W is n times that of the first MOS transistor 1221a, and the like are used as the third MOS transistor 1231.

The first switch element 1236a is provided between the second power supply source 1212 and the second current generation unit 1237. The second switch element 1236b is provided on the connection wiring 1233. The control of ON/OFF of the first switch element 1236a and the second switch element 1236d is executed by the start-up control circuit 1260.

Each of the switch elements of the auxiliary circuit 1230 is switched to ON by the start-up control circuit 1260, in accordance with a timing when the input voltage $V_{IN}$ is input. In the auxiliary circuit 1230, the third MOS transistor 1231 is driven by the auxiliary current ($n \times I_{IN}$), and generates a source-drain voltage as the auxiliary voltage. The auxiliary voltage is a value identical to that of a source-drain voltage of the first MOS transistor 1221a which is driven by the input current $I_{IN}$.

A part of the auxiliary current flows into the application point 1223 of the target circuit 1220, and the capacitor portion 1224 is promptly charged. In addition, the auxiliary voltage is output to the application point 1223, and a gate voltage of the first MOS transistor 1221a and the second MOS transistor 1221b is promptly raised to a voltage at the time of performing the stationary operation. Accordingly, it is possible to sufficiently reduce a start-up time of the constant current circuit (the target circuit 1220) which outputs the output current $I_{OUT}$ as the output power. In addition, in a case in which a predetermined time has elapsed, each of the switch elements is switched to OFF. Accordingly, it is possible to realize low power consumption without increasing power consumption of the auxiliary circuit 1230.

An electric circuit 1300 illustrated in FIG. 17 includes a target circuit 1320, an auxiliary circuit 1330, and a start-up control circuit 1360. The target circuit 1320 has a configuration which is identical to that of the target circuit 1220 illustrated in FIG. 16. That is, the target circuit 1320 has a current mirror configuration including a first current generation unit 1326, and a first MOS transistor 1321a and a second MOS transistor 1321b, and functions as a constant current circuit.

The auxiliary circuit 1330 includes a second current generation unit 1337, a third MOS transistor 1331, and an amplifier element 1370. The second current generation unit 1337 outputs the current $I_{IN}$ which is identical to that of the first current generation unit 1326. The third MOS transistor 1331 has the conductance coefficient K which is identical to that of the first MOS transistor 1321a, and generates a source-drain voltage on the basis of the current which is output by the second current generation unit 1337. The amplifier element 1370 functions as a voltage follower which outputs the source-drain voltage of the third MOS transistor 1331 as the auxiliary voltage.

Each of the switch elements of the auxiliary circuit 1330 is switched to ON by the start-up control circuit 1360, in accordance with a timing when the input voltage $V_{IN}$ is input. The third MOS transistor 1331 generates a voltage which is identical to the source-drain voltage of the first MOS transistor, and outputs the voltage to the amplifier element 1370. The amplifier element 1370 generates a voltage which is identical to the input voltage (the source-drain voltage of the third MOS transistor 1331) as the auxiliary voltage, and outputs the voltage to the application point 1323 of the target circuit. Accordingly, the current mirror circuit is promptly started up, and it is possible to sufficiently reduce a start-up time of the target circuit 1320. In addition, in a case in which a predetermined time has elapsed, each of the switch elements is switched to OFF. Accordingly, it is possible to realize low power consumption without increasing power consumption of the auxiliary circuit 1330.

FIG. 18 to FIG. 21 are circuit diagrams illustrating an example in a case in which the target circuit has the other configuration.

Figure 18:
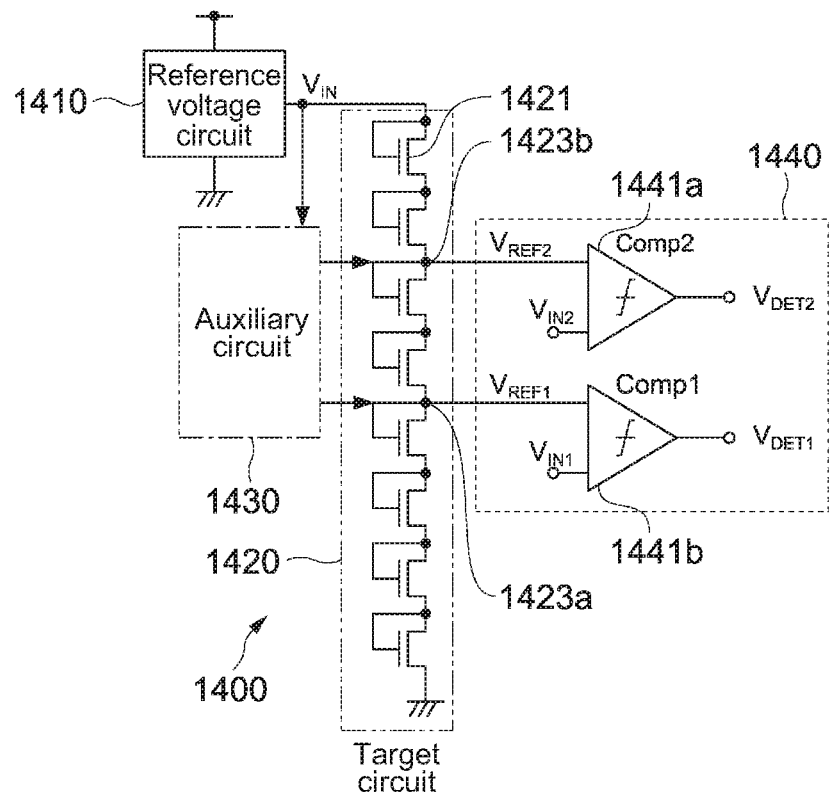
FIG. 18 is a circuit diagram illustrating an example in a case in which the target circuit has the other configuration.

An electric circuit 1400 illustrated in FIG. 18 includes a reference voltage circuit 1410, a target circuit 1420, an auxiliary circuit 1430, and a driving circuit 1440. The reference voltage circuit 1410 generates a reference voltage such as a bandgap voltage, and outputs the reference voltage to the target circuit 1420 and the auxiliary circuit 1430 as the input voltage $V_{IN}$.

The target circuit 1420 includes eight MOS transistors 1421 having properties identical to each other, and functions as the voltage-dividing circuit which divides the input voltage $V_{IN}$ (the reference voltage). The target circuit 1420 includes a first application point 1423a and a second application point 1423b. Each of the application points are provided on wiring to which the adjacent MOS transistor is connected. In addition, a first reference voltage $V_{REF1}$ and a second reference voltage $V_{REF2}$ are respectively output from the first application point 1423a and the second application point 1423b.

As illustrated in FIG. 18, the first application point 1423a is provided on wiring in which the input voltage $V_{IN}$ is divided into ½, and the second application point 1423b is provided on wiring in which the input voltage $V_{IN}$ is divided into ¾. Accordingly, the first reference voltage $V_{REF1}$ is $V_{IN} \times ½$, and the second reference voltage $V_{REF2}$ is $V_{IN} \times ¾$. The configuration and the like of the target circuit 1420 are not limited, and for example, each of the application points may be provided in other positions. In addition, two or more application points may be suitably provided on the target circuit 1420.

The auxiliary circuit 1430 outputs the auxiliary voltage corresponding to each of the first application point 1423a and the second application point 1423b. That is, the auxiliary circuit 1430 outputs $V_{IN} \times ¾$ to the first application point 1423a as the auxiliary voltage, and outputs $V_{IN} \times ½$ to the second application point 1423b as the auxiliary voltage. A specific configuration of the auxiliary circuit 1430 is not limited, and for example, the voltage-dividing circuit which are capable of outputting the auxiliary voltage, and the like described in the other examples described above may be suitably used.

The driving circuit 1440 includes a first comparator 1441a and a second comparator 1441b. The first comparator 1441a functions as a comparison element which compares a first comparison voltage $V_{IN1}$ with the first reference voltage $V_{REF1}$, and outputs a first detection voltage $V_{DET1}$ on the basis of a comparison result. In addition, the second comparator 1441b functions as a comparison element which compares a second comparison voltage $V_{IN2}$ with the second reference voltage $V_{REF2}$, and outputs a second detection voltage $V_{DET2}$ on the basis of a comparison result.

in accordance with a timing when the input voltage $V_{IN}$ (the reference voltage) is input into the target circuit 1420, the auxiliary voltages corresponding to the first application point 1423a and the second application point 1423b are respectively output by the auxiliary circuit 1430. Accordingly, the first reference voltage $V_{REF1}$ and the second reference voltage $V_{REF2}$ are promptly raised, and are output to the driving circuit 1440. As a result thereof, it is possible to sufficiently speed up a response speed and the like of the driving circuit 1440. Thus, it is possible to speed up the start, the response speed, and the like of the circuit by the auxiliary circuit 1430.

Figure 19:
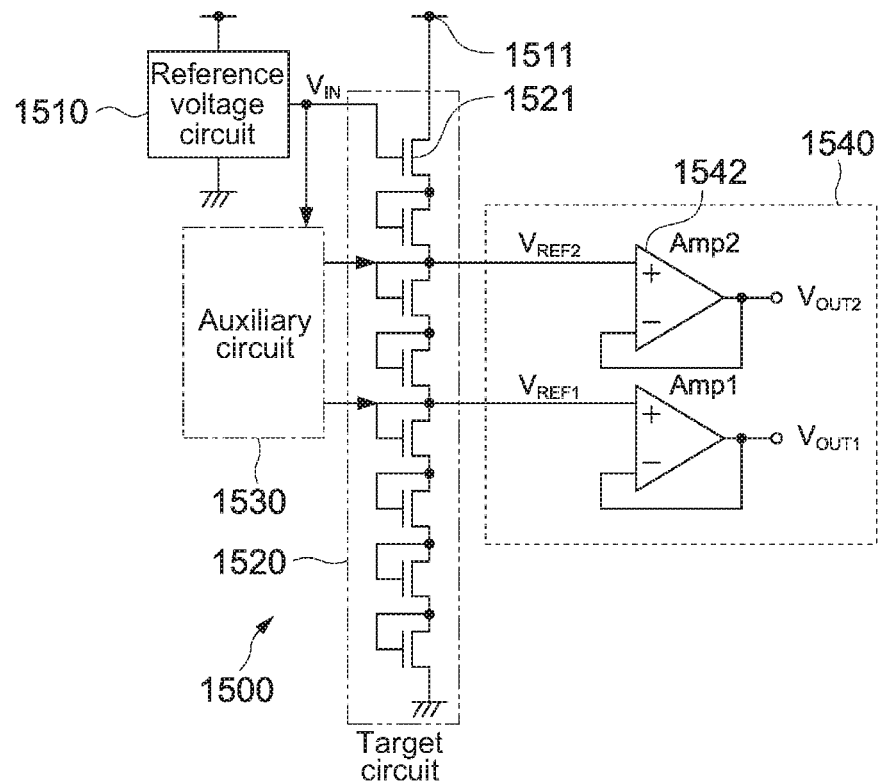
FIG. 19 is a circuit diagram illustrating an example in a case in which the target circuit has the other configuration.

In the electric circuit 1500 illustrated in FIG. 19, a driving circuit 1540 including two amplifier elements 1542 configured as the voltage follower is used instead of the driving circuit 1440 illustrated in FIG. 18. In addition, the target circuit 1520 has a source follower configuration in which a drain of the MOS transistor 1521 at the highest potential in eight MOS transistors 1521 is connected to the power source portion 1511 having a high potential. Even in such a case, the reference voltage ($V_{REF1}$ and $V_{REF2}$) which is input into each of the amplifier elements 1542 is promptly generated by the auxiliary circuit 1530 and the target circuit 1540. Thus, the reference voltage is rapidly raised, and thus, it is possible to sufficiently speed up the response speed and the like of the driving circuit 1540.

Figure 20:
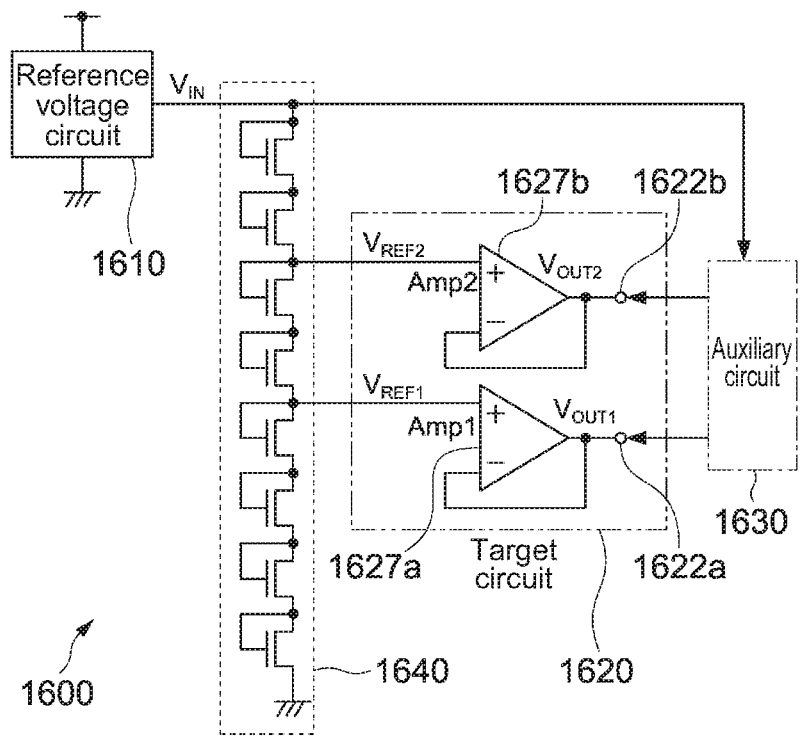
FIG. 20 is a circuit diagram illustrating an example in a case in which the target circuit has the other configuration.

An electric circuit 1600 illustrated in FIG. 20 includes a reference voltage circuit 1610, a voltage-dividing circuit 1640, a target circuit 1620, and an auxiliary circuit 1630. The reference voltage circuit 1610, the voltage-dividing circuit 1640, and the target circuit 1620 have configurations which are respectively identical to the reference voltage circuit 1510, the target circuit 1520, and the driving circuit 1540 illustrated in FIG. 19. That is, in an electric circuit 1900, the driving circuit 1640 illustrated in FIG. 19 is used as the target circuit 1620.

The voltage-dividing circuit 1640 divides the input voltage $V_{IN}$, and generates the first reference voltages $V_{REF1}$ and the second reference voltages $V_{REF2}$.

The target circuit 1620 includes a first amplifier element 1627a and a second amplifier element 1627b, and a first output point 1622a and a second output point 1622b. The first amplifier element 1627a outputs a first output voltage $V_{OUT1}$ identical to $V_{REF1}$ to the first output point 1622a on the basis of the first reference voltage $V_{REF1}$ which is output from the voltage-dividing circuit 1640, as the output power. The second amplifier element 1627b outputs a second output voltage $V_{OUT2}$ identical to $V_{REF2}$ to the second output point 1622b on the basis of the second reference voltage $V_{REF2}$ which is output from the voltage-dividing circuit 1640, as the output power. Note that, the output points are respectively connected to loads (not illustrated).

The input voltage $V_{IN}$ is input into the auxiliary circuit 1630 from the reference voltage circuit 1610. The auxiliary circuit 1630 generates a first auxiliary voltage which is a voltage identical to the first output voltage $V_{OUT1}$, and a second auxiliary voltage which is a voltage identical to the second output voltage $V_{OUT2}$, on the basis of the input voltage $V_{IN}$.

The auxiliary circuit 1630, for example, outputs the first auxiliary voltage and the second auxiliary voltage to the first output point 1622a and the second output point 1622b, respectively, in accordance with a timing when the input voltage $V_{IN}$ is input. Accordingly, it is possible to raise the first output voltage $V_{OUT1}$ and the second output voltage $V_{OUT2}$ at a high speed. Thus, the auxiliary voltage corresponding to each of the output points is directly output in accordance with a start-up timing of the target circuit 1620. As a result thereof, it is possible to considerably reduce a start-up time of the target circuit 1620.

In the target circuit 1620, the first output point 1622a is a first application point to which the first output voltage $V_{OUT1}$ corresponding to the output power of the first amplifier element 1627a is applied. Similarly, the second output point 1622b is a second application point to which the second output voltage $V_{OUT2}$ is applied. That is, in the electric circuit 1600 illustrated in FIG. 21, the application points are respectively provided on the corresponding output points. Thus, there can be a case in which the application point and the output point are provided on the same point. Accordingly, it is possible to promptly supply the output power output from the target circuit 1600, and it is possible to speed up a response speed with respect to the input voltage $V_{IN}$.

Figure 21:
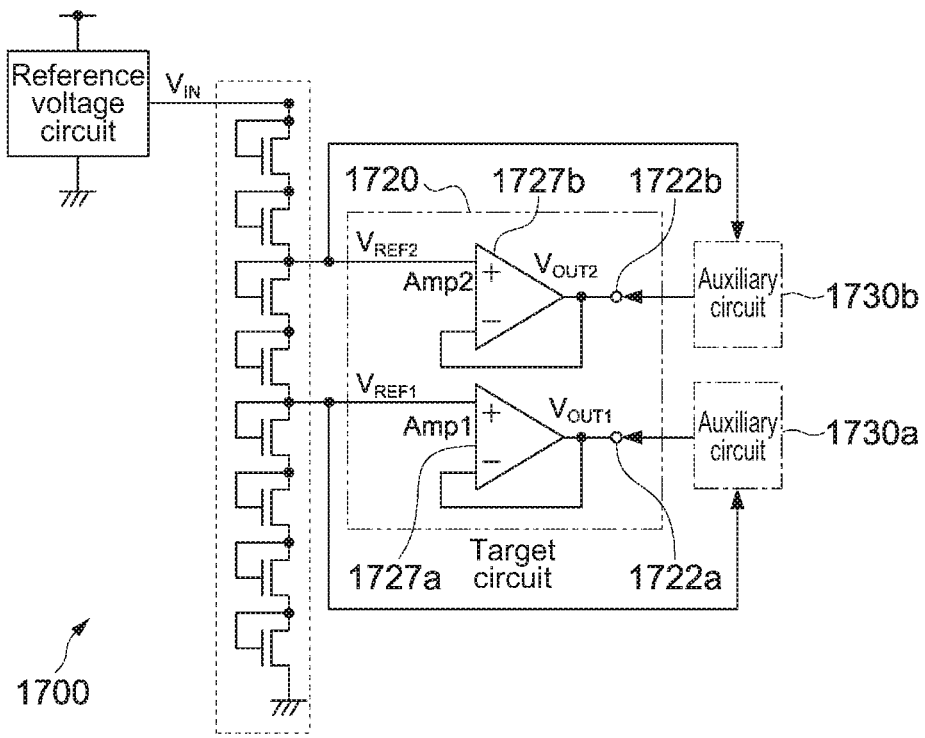
FIG. 21 is a circuit diagram illustrating an example in a case in which the target circuit has the other configuration.

In an electric circuit 1700 illustrated in FIG. 21, a first auxiliary circuit 1730a and a second auxiliary circuit 1730b are used instead of the auxiliary circuit 1630 illustrated in FIG. 20. The first auxiliary circuit 1730a and the second auxiliary circuit 1730b are respectively configured to generate the first auxiliary voltage and the second auxiliary voltage on the basis of the first reference voltage $V_{REF1}$ and the second reference voltage $V_{REF2}$. The first auxiliary voltage and the second auxiliary voltage are suitably output to a first output point 1722a and a second output point 1722b of a first amplifier element 1727a and a second amplifier element 1727b of a target circuit 1720. Accordingly, the voltage on each of the output points is promptly raised by each of the auxiliary voltages, and it is possible to sufficiently reduce a start-up time of the target circuit 1720.

Figure 22:
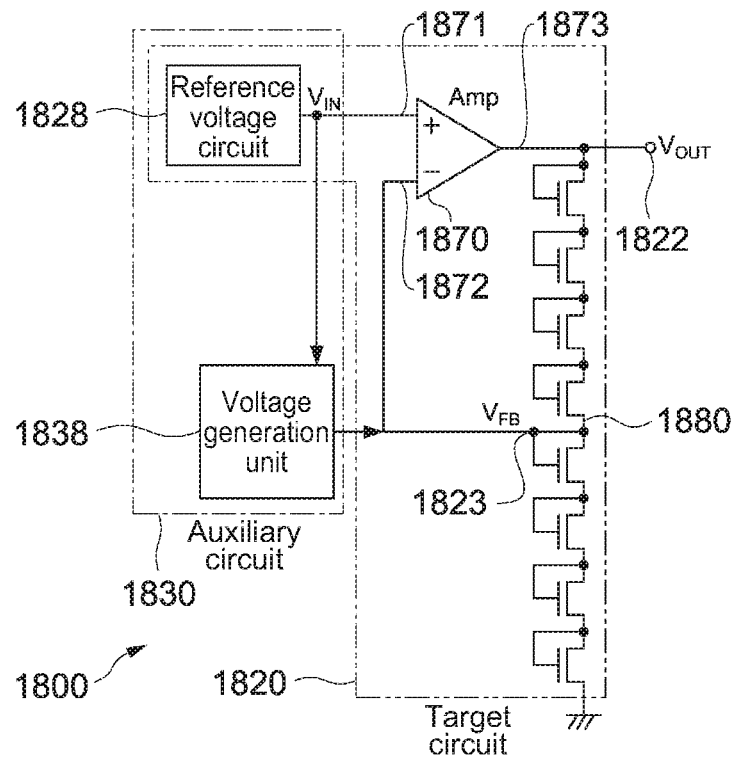
FIG. 22 is a circuit diagram illustrating an example in a case in which the target circuit is an amplification circuit.
Figure 23:
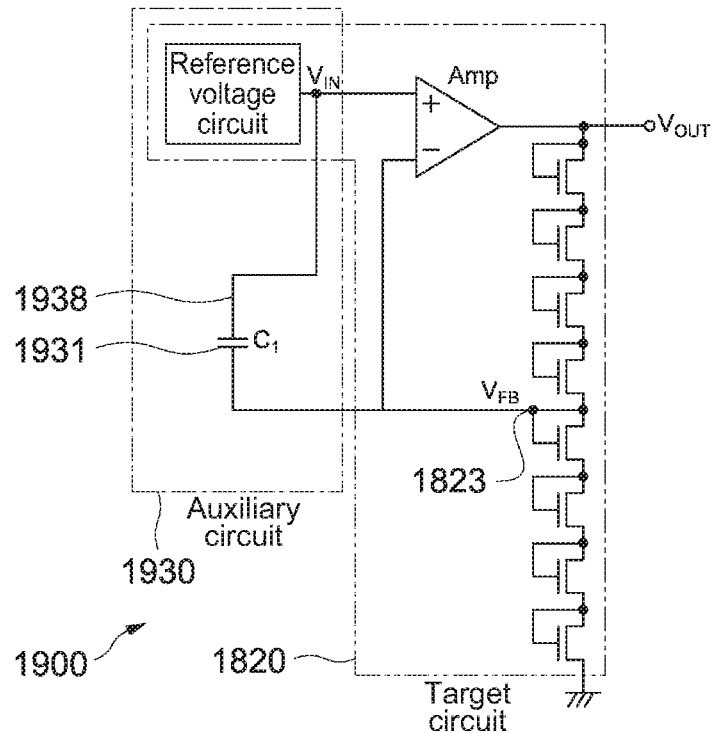
FIG. 23 is a circuit diagram illustrating a specific configuration example of the auxiliary circuit illustrated in FIG. 22.
Figure 24:
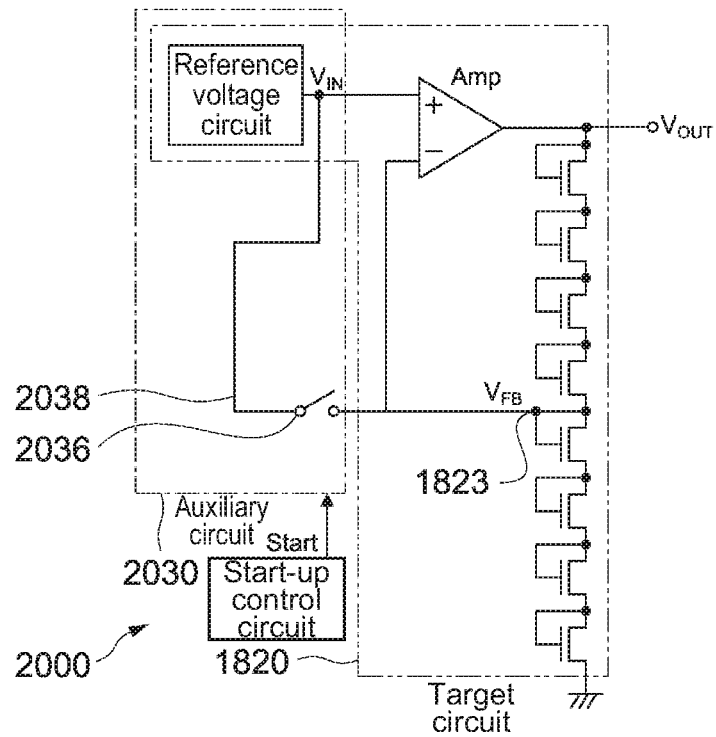
FIG. 24 is a circuit diagram illustrating a specific configuration example of the auxiliary circuit illustrated in FIG. 22.
Figure 25:
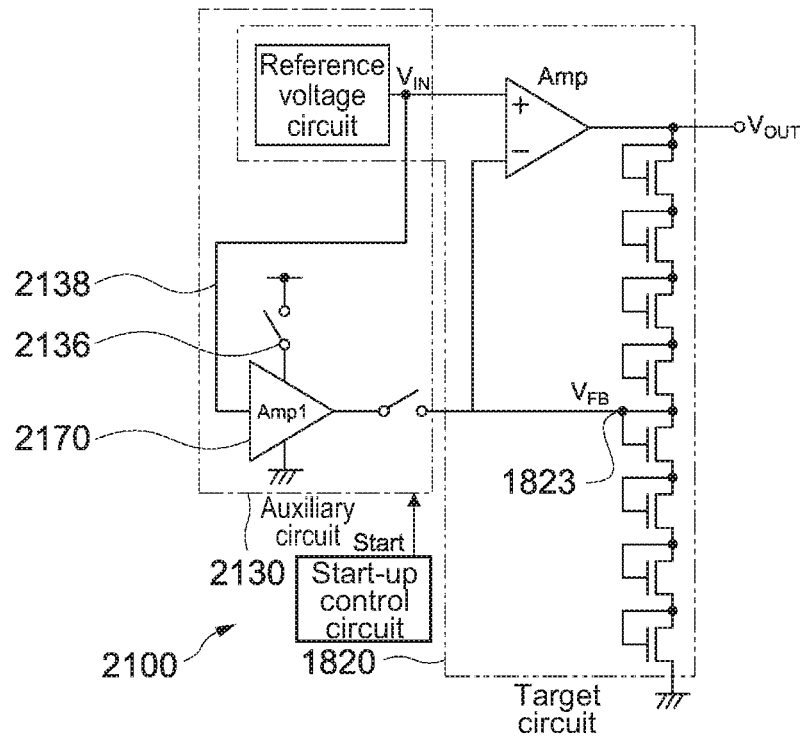
FIG. 25 is a circuit diagram illustrating a specific configuration example of the auxiliary circuit illustrated in FIG. 22.

FIG. 22 is a circuit diagram illustrating an example in a case in which the target circuit is an amplification circuit. FIG. 23 to FIG. 25 are circuit diagrams illustrating a specific configuration example of an auxiliary circuit 1830 illustrated in FIG. 22.

An electric circuit 1800 illustrated in FIG. 22 includes a target circuit 1820 and the auxiliary circuit 1830. The target circuit 1820 includes a reference voltage circuit 1828, an amplifier element 1870, a gain resistance portion 1880, and an output point 1822. The reference voltage circuit 1828 is connected to a power supply source (not illustrated), and generates an arbitrary reference voltage. The reference voltage is output as the input voltage $V_{IN}$.

The amplifier element 1870 includes a non-inversion input terminal 1871, an inversion input terminal 1872, and an output terminal 1873. The input voltage $V_{IN}$ is input into the non-inversion input terminal 1871. A feedback voltage $V_{FB}$ is input into the inversion input terminal 1872 through the gain resistance portion 1880. The output terminal 1873 is connected to the output point 1822, and outputs the output voltage $V_{OUT}$ as the output power.

The gain resistance portion 1880 has a configuration which is identical to that of the voltage-dividing circuit (the target circuit 723) using the MOS transistor illustrated in FIG. 11. The gain resistance portion 1880 is connected between the output terminal 1873 of the amplifier element 1870 and GND. Accordingly, the gain resistance portion 1880 functions as the voltage-dividing circuit which divides the output voltage $V_{OUT}$ into ½, and outputs the output voltage $V_{OUT}$ from an application point 1823. The voltage of the application point 1823 is output to the inversion input terminal 1872 as the feedback voltage $V_{FB}$.

In the amplifier element 1870, the potential of the non-inversion input terminal 1871 and the potential of the inversion input terminal 1872 are approximately identical to each other (imaginary short). Accordingly, the amplifier element 1870 is operated such that the input voltage $V_{IN}$ and the feedback voltage $V_{FB}$ are identical to each other. As a result thereof, $V_{IN}=V_{FB}=V_{OUT2}$ is obtained, and $V_{OUT}=2\times V_{IN}$ is obtained. That is, the target circuit 1820 functions as an amplification circuit which amplifies the input voltage $V_{IN}$ (the reference voltage) twice and outputs the input voltage $V_{IN}$. Note that, an amplification factor and the like of the target circuit 1820 are not limited, and for example, the gain resistance portion 1880 and the like may be suitably configured such that desired amplification is performed with respect to the input voltage $V_{IN}$.

The auxiliary circuit 1830 includes a reference voltage circuit 1828 and a voltage generation unit 1838. Accordingly, in the example illustrated in FIG. 22, the auxiliary circuit 1830 is configured to include the reference voltage circuit 1828 which is a part of the target circuit 1820.

The voltage generation unit 1838 is provided on wiring which joins the reference voltage circuit 1828 and the application point 1823 together. The voltage generation unit 1838 generates the auxiliary voltage on the basis of the input voltage $V_{IN}$ which is output from the reference voltage circuit 1828, and outputs the auxiliary voltage to the application point 1823 of the target circuit 1820. The voltage generation unit 1838 is configured such that the value of the auxiliary voltage is identical to the voltage of the application point 1823 (the feedback voltage $V_{FB}$). Accordingly, in FIG. 22, a voltage which is equal to the input voltage $V_{IN}$ is generated as the auxiliary voltage.

For example, in an electric circuit 1900 illustrated in FIG. 23, a capacitor 1931 is used as a voltage generation unit 1938. The capacitance C1 of the capacitor 1831, for example, is set such that the impedance of the capacitor 1838 with respect to a high-frequency current sufficiently decreases. In an electric circuit 2000 illustrated in FIG. 24, a switch element 2036 is used as a voltage generation unit 2038. In addition, in an electric circuit 2100 illustrated in FIG. 25, a voltage follower circuit including a switch element 2136 and an amplifier element 2170 is used as a voltage generation unit 2138.

In the voltage generation units 1938 to 2138 illustrated in FIG. 23 to FIG. 25, the auxiliary voltage which is approximately identical to the input voltage $V_{IN}$ is output to the application point 1823 in accordance with a timing when the input voltage $V_{IN}$ is input. Accordingly, it is possible to promptly raise the feedback voltage $V_{FB}$ to a voltage which is equal to the input voltage $V_{IN}$.

A response until the feedback voltage $V_{FB}$ reaches a target voltage of (the input voltage $V_{IN}$) is assisted, and thus, the output voltage $V_{OUT}$ of the target circuit 1820 is rapidly raised to a value ($2\times V_{IN}$) in which the input voltage $V_{IN}$ is amplified. Accordingly, it is possible to sufficiently reduce a start-up time of the amplification circuit which is the target circuit 1820.

Thus, the auxiliary voltage is output to the application point 1823 to which a voltage for outputting the output voltage $V_{OUT}$ of the target circuit 1820 (the feedback voltage $V_{FB}$) is applied, and thus, it is possible to speed up the start of the entire target circuit 1820.

Figure 26:
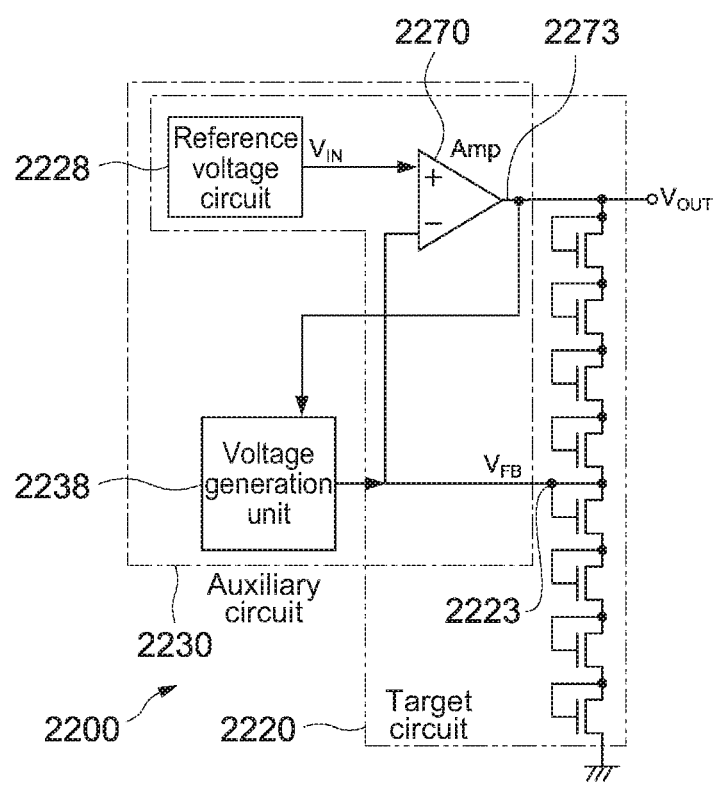
FIG. 26 is a circuit diagram illustrating another example in a case in which the target circuit is the amplification circuit.

FIG. 26 is a circuit diagram illustrating another example in a case in which the target circuit is the amplification circuit. FIG. 27 to FIG. 31 are circuit diagrams illustrating a specific configuration example of an auxiliary circuit 2230 illustrated in FIG. 26. In an electric circuit 2300 illustrated in FIG. 26, a target circuit 2320 having a configuration which is identical to that of the amplification circuit (the target circuit 1820) illustrated in FIG. 22 is used.

The auxiliary circuit 2230 includes a reference voltage circuit 2228, an amplifier element 2270, and a voltage generation unit 2238. Accordingly, in the example illustrated in FIG. 26, the auxiliary circuit 2230 is configured to include the reference voltage circuit 2228 and the amplifier element 2270 which are a part of the target circuit 2220.

The voltage generation unit 2238 is provided on wiring which joins an output terminal 2273 of the amplifier element 2270 and an application point 2223 together. The voltage generation unit 2238 generates the auxiliary voltage on the basis of the output voltage $V_{OUT}$ which is output from the output terminal 2273, and outputs the auxiliary voltage to the application point 2223 of the target circuit 2220. The voltage generation unit 2238 is configured such that the value of the auxiliary voltage is identical to that of the voltage of the application point 2223 (the feedback voltage $V_{FB}$). Accordingly, in FIG. 26, a voltage which is equal to a half of the output voltage $V_{OUT}$ ($V_{OUT}/2$) is generated as the auxiliary voltage.

Figure 27:
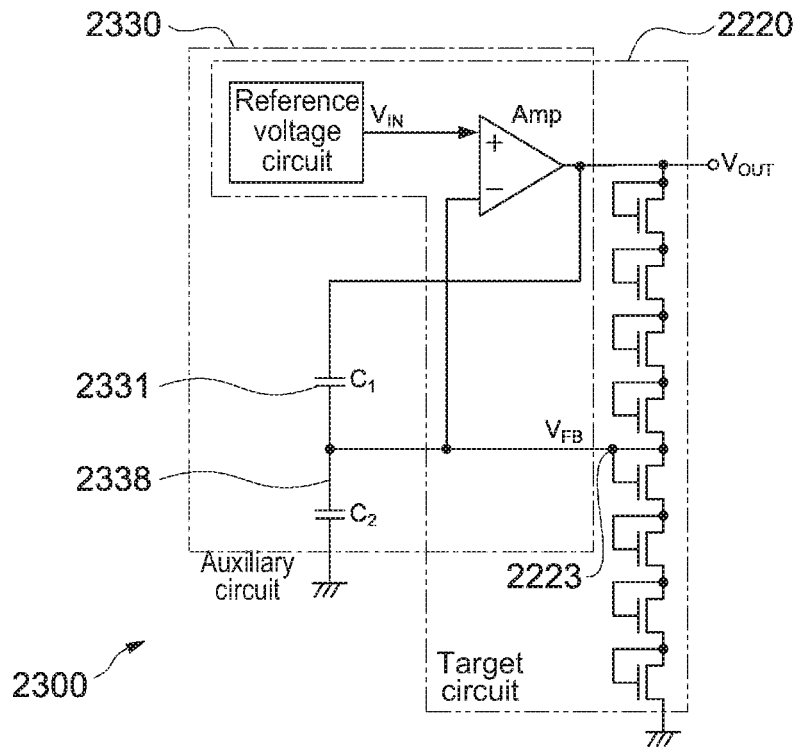
FIG. 27 is a circuit diagram illustrating a specific configuration example of the auxiliary circuit illustrated in FIG. 26.

For example, in an electric circuit 2300 illustrated in FIG. 27, a voltage-dividing circuit using two capacitors 2331 is used as a voltage generation unit 2338. In an electric circuit 2400 illustrated in FIG. 28, a voltage-dividing circuit using a resistance element 2435 is used as a voltage generation unit 2438. The voltage generation units 2338 and 2438 illustrated in FIG. 27 and FIG. 28 function as the voltage-dividing circuit which divides the output voltage $V_{OUT}$ into ½.

Figure 28:
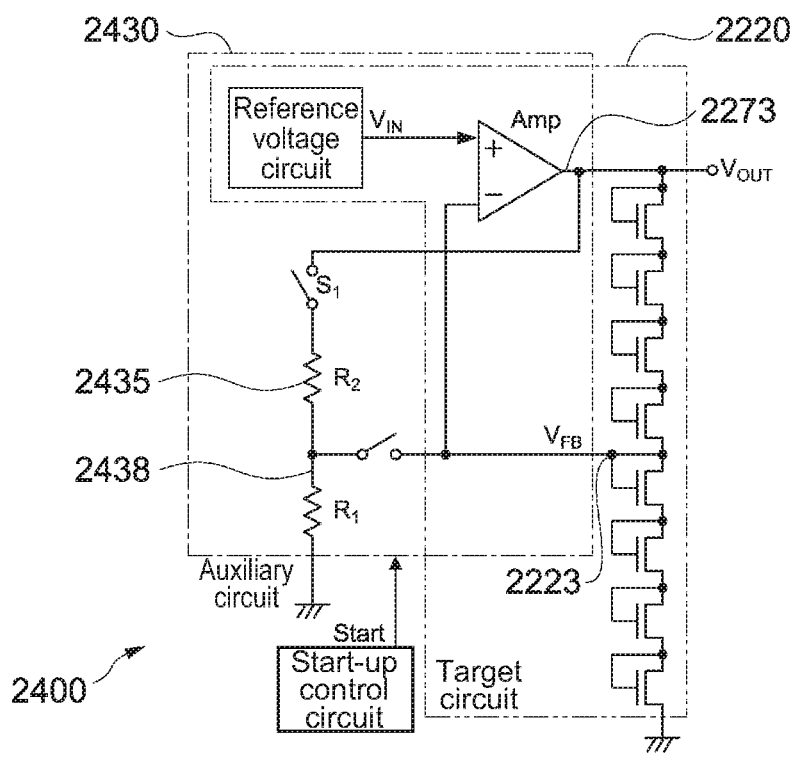
FIG. 28 is a circuit diagram illustrating a specific configuration example of the auxiliary circuit illustrated in FIG. 26.
Figure 29:
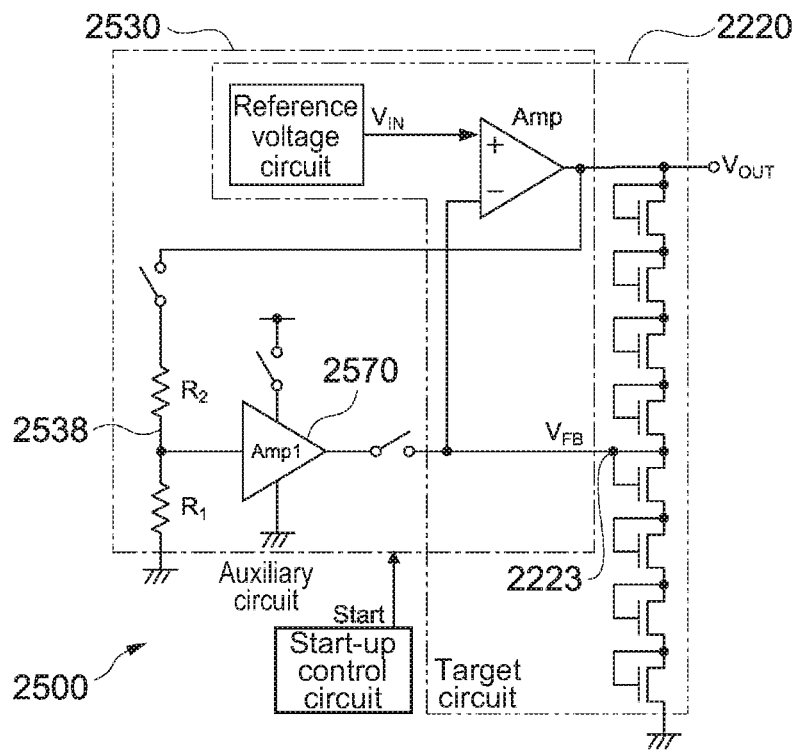
FIG. 29 is a circuit diagram illustrating a specific configuration example of the auxiliary circuit illustrated in FIG. 26.
Figure 30:
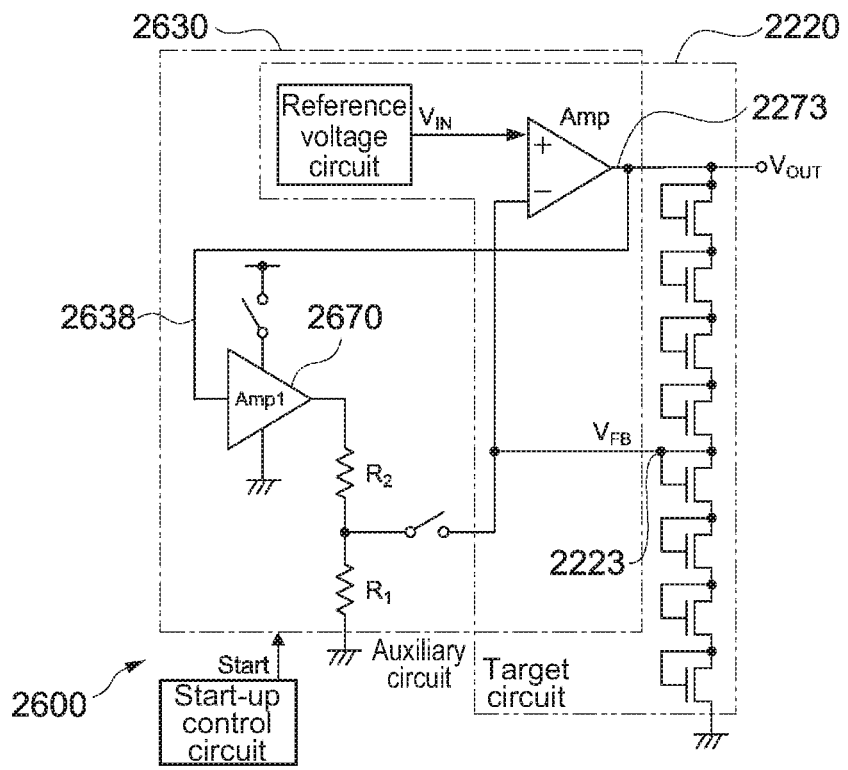
FIG. 30 is a circuit diagram illustrating a specific configuration example of the auxiliary circuit illustrated in FIG. 26.

In an electric circuit 2500 illustrated in FIG. 29, a configuration in which an amplifier element 2570 (a voltage follower circuit) is arranged between the voltage generation unit 2438 and the application point 2223 illustrated in FIG. 28 is used as a voltage generation unit 2538. In addition, in an electric circuit 2600 illustrated in FIG. 30, a configuration in which an amplifier element 2670 is arranged between the output terminal 2273 and the voltage generation unit 2438 illustrated in FIG. 28 is used as a voltage generation unit 2638. The amplifier element is used, and thus, for example, it is possible to promptly supply a sufficient current to the application point 2223.

Figure 31:
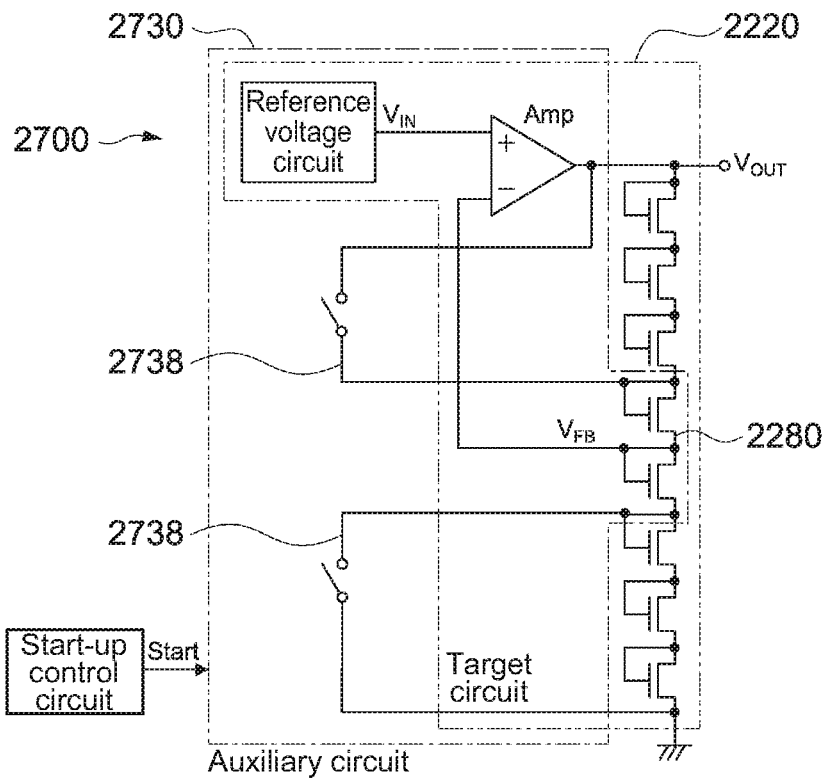
FIG. 31 is a circuit diagram illustrating a specific configuration example of the auxiliary circuit illustrated in FIG. 26.

In an electric circuit 2700 illustrated in FIG. 31, a configuration in which a part of the gain resistance portion 2280 of the target circuit 2220 is short-circuited is used as a voltage generation unit 2738. As with the auxiliary circuits 630 and 1130 illustrated in FIG. 10 and FIG. 15, the voltage generation unit 2738, for example, short-circuits a part of the gain resistance portion 2280 configuring the voltage-dividing circuit, and thus, promptly generates the feedback voltage $V_{FB}$.

In the voltage generation units 2238 to 2738 illustrated in FIG. 26 to FIG. 31, the auxiliary voltage which is approximately identical to the input voltage $V_{IN}$ is output to the application point 2223 in accordance with a timing when the input voltage $V_{IN}$ is input. Accordingly, it is possible to promptly raise the feedback voltage $V_{FB}$ to a voltage equal to the input voltage $V_{IN}$. Accordingly, it is possible to sufficiently reduce a start-up time of the amplification circuit which is the target circuit 2220.

In the above description, the voltage-dividing circuit (FIG. 1, FIG. 5, and FIG. 7 to FIG. 15), the constant current circuit (FIG. 16 and FIG. 17), the comparison circuit (FIG. 18), the constant voltage circuit (FIG. 19 to FIG. 21), and the amplification circuit (FIG. 22 to FIG. 31) are used as the target circuit. In addition, the circuit which has impedance lower than that of the target circuit, and is capable of outputting the auxiliary voltage to the application point of the target circuit is used as the auxiliary circuit.

The present technology is not limited thereto, and for example, an arbitrary analog circuit, an arbitrary digital circuit, and the like can be used as the target circuit. In this case, the auxiliary circuit which is capable of outputting the auxiliary voltage corresponding to the voltage and the like of the application point of the target circuit is suitably configured, and thus, it is possible to sufficiently reduce the start-up time of the target circuit. Accordingly, for example, even in the case of a circuit having an ultrahigh-impedance configuration, it is possible to start up the circuit at a high speed, and it is possible to realize an electric circuit of extremely low power consumption.

Third Embodiment

Figure 32:
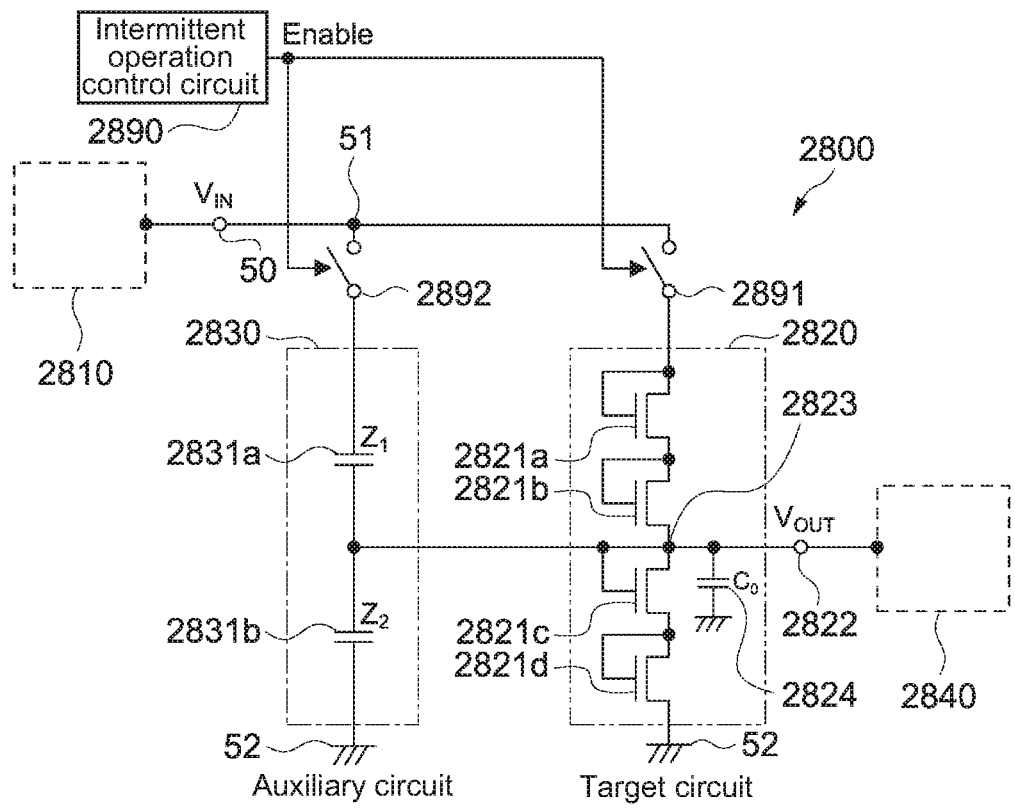
FIG. 32 is a circuit diagram illustrating a configuration example of an electric circuit according to a third embodiment.

FIG. 32 is a circuit diagram illustrating a configuration example of an electric circuit 2800 according to a third embodiment. The electric circuit 2800 includes a power supply source 2810, a target circuit 2820, an auxiliary circuit 2830, a driving circuit 2840, a first switch element 2891, a second switch element 2892, and an intermittent operation control circuit 2890. In addition, the electric circuit 2800 includes the input point 50, the branch point 51, and the ground point 52.

The power supply source 2810, the target circuit 2820, the auxiliary circuit 2830, and the driving circuit 2840 of the electric circuit 2800 illustrated in FIG. 32 have configurations which are respectively identical to those of the power supply source 10, the target circuit 20, the auxiliary circuit 30, and the driving circuit 40 of the electric circuit 100 illustrated in FIG. 1.

The power supply source 2810 outputs the input voltage $V_{IN}$ to the input point 50. The input point 50 is connected to the branch point 51. The target circuit 2820 has a configuration in which a first MOS transistor 2821a to a fourth MOS transistor 2821d are connected in series. The target circuit 2820 divides the input voltage $V_{IN}$ into ½, generates the output voltage $V_{OUT}$, and outputs the output voltage $V_{OUT}$ to the driving circuit 2840. The auxiliary circuit 2830 has a configuration in which a first capacitor 2831a and a second capacitor 2831b are connected in series. The auxiliary circuit 2830 divides the input voltage $V_{IN}$ into ½, generates the auxiliary voltage, and outputs the auxiliary voltage to an application point 2823 of the target circuit 2820.

The first switch element 2891 is provided between the branch point 51 and the first MOS transistor 2821a of the target circuit 2820. As illustrated in FIG. 32, in a case in which the first switch element 2891 is turned ON (OFF), wiring between the power supply source 2810 (the branch point 51) and the target circuit 2820 becomes conductive (is cut off). In this embodiment, the first switch element 2891 corresponds to a first switch portion.

The second switch element 2892 is provided between the branch point 51 and the first capacitor 2831a of the auxiliary circuit 2830. As illustrated in FIG. 32, in a case in which the second switch element 2892 is turned ON (OFF), wiring between the power supply source 2810 (the branch point 51) and the auxiliary circuit 2830 becomes conductive (is cut off). In this embodiment, the second switch element 2892 corresponds to a second switch portion.

The intermittent operation control circuit 2890 controls the switching of ON/OFF of the first switch element 2891 and the second switch element 2892. The intermittent operation control circuit 2890 outputs a control signal for controlling each of the switch elements (in FIG. 32, represented as Enable). The control signal is input into a control terminal (not illustrated) of each of the switch elements.

In this embodiment, a common control signal is output to the first switch element 2891 and the second switch element 2892. That is, the intermittent operation control circuit 2890 synchronizes each of the switch elements on the basis of the control signal, and performs the same control at the same timing. Accordingly, each of the switch elements is synchronously operated such that ON/OFF is simultaneously switched. The present technology is not limited thereto, and for example, ON/OFF of each of the switch elements may be individually switched.

In this embodiment, the first switch element 2891 and the second switch element 2892 cooperate with the intermittent operation control circuit 2890, and thus, an intermittent switch portion is realized. Note that, a case in which the first switch portion 2891 and the second switch portion 2892 are turned ON corresponds to a case in which the intermittent switch portion is turned ON, and a case in which the first switch portion 2891 and the second switch portion 2892 are turned OFF corresponds to a case in which the intermittent switch portion is turned OFF.

Figure 33:
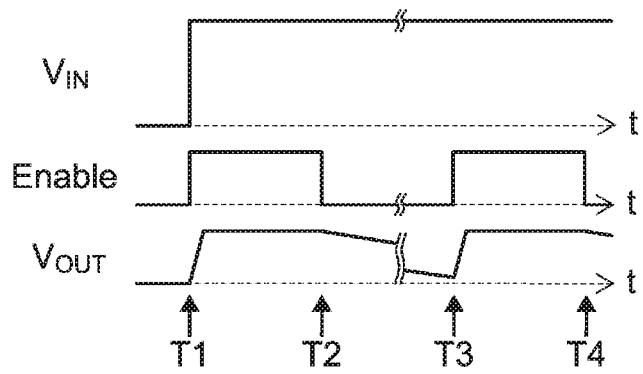
FIG. 33 is a schematic view for illustrating an operation waveform of the electric circuit illustrated in FIG. 32.

FIG. 33 is a schematic view for illustrating an operation waveform of the electric circuit 2800 illustrated in FIG. 32. In FIG. 33, the waveform of the input voltage $V_{IN}$ which is output from the power supply unit 2810, the waveform of the control signal (Enable) which is output from the intermittent operation control circuit 2890, and the waveform of the output voltage $V_{OUT}$ which is output from the target circuit 2820 are schematically illustrated along the time axis t.

The input voltage $V_{IN}$ is output at a first time T1 by the power supply source 2810. The control signal for setting the first switch element 2891 and the second switch element 2892 to be ON is output approximately simultaneously with the first time T1 by the intermittent operation control circuit 2890. Each of the switch elements is simultaneously switched to ON on the basis of the control signal. Accordingly, the input voltage $V_{IN}$ is approximately simultaneously input into the target circuit 2820 and the auxiliary circuit 2830.

In the auxiliary circuit 2830, a high-frequency current included in the rise of the input voltage $V_{IN}$ passes through the first capacitor 2831a, and flows into the application point 2823 of the target circuit 2820, and thus, the capacitor portion 2824 is charged. In addition, in the auxiliary circuit 2830, the input voltage $V_{IN}$ is divided into ½, and the auxiliary voltage is generated. The auxiliary voltage is output to the application point 2823, and the voltage of the application point 2823 (an output point 2822) is promptly raised to $V_{IN}/2$. Accordingly, a start-up time of the target circuit 2820 is sufficiently reduced.

Figure 34:
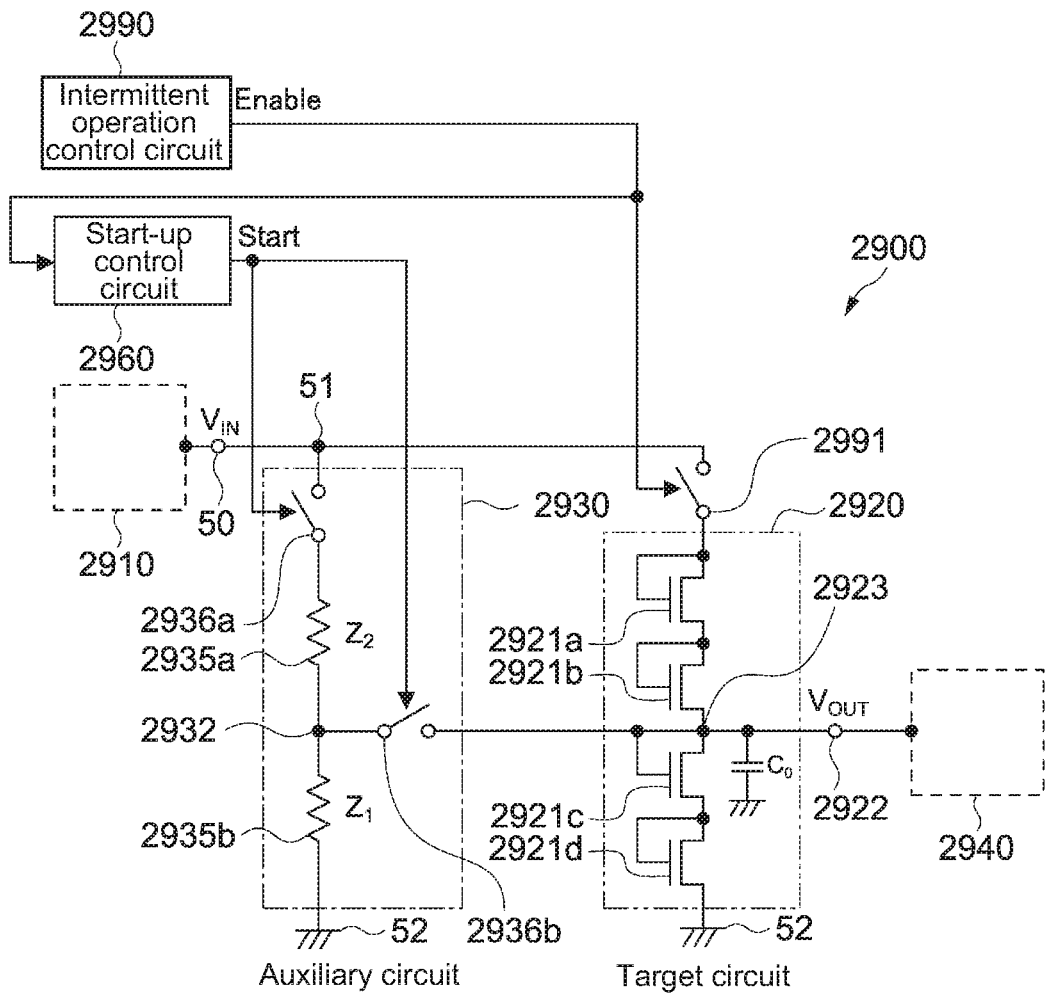
FIG. 34 is a circuit diagram illustrating a configuration example of an electric circuit according to a fourth embodiment.

In a case in which the output voltage $V_{OUT}$ of the target circuit 2820 reaches $V_{IN}/2$, the target circuit 2820 proceeds to a start-up state. As illustrated in FIG. 34, the control signal for setting the first switch element 2891 and the second switch element 2892 to be ON is continuously output from the intermittent control circuit 2890 between the first time T1 to a second time T2. Accordingly, in the target circuit 2820, the start-up state is maintained until the second time T2. Note that, in a case in which the target circuit 2820 is in the start-up state, a stationary current does not flow the auxiliary circuit 2830. For this reason, even in a case in which the auxiliary circuit 2830 is connected to the branch point 51, power consumption does not increase.

The first switch element 2891 and the second switch element 2892 are switched to OFF at the second time T2 by the intermittent operation control circuit 2890. As a result thereof, power supply with respect to the target circuit 2820 is cut, and the target circuit 2820 proceeds to a dormant state from the start-up state in which the output voltage $V_{OUT}$ is output. Note that, the input voltage $V_{IN}$ which is output from the power supply unit 2810 is not cut.

In FIG. 34, it is illustrated that the value of the output voltage $V_{OUT}$ gradually decreases after the second time T2. For example, this corresponds to a procedure in which the charge which is charged in the capacitor portion 2824 of the target circuit 2820, each of the capacitors of the auxiliary circuit 2830, and the like is discharged. For example, a circuit for promptly releasing the charge may be provided.

The first switch element 2891 and the second switch element 2892 are switched again to ON after a predetermined interval from the second time T2 (a third time T3) by the intermittent operation control circuit 2890. At this time, the power supply unit 2810 is in a state where the input voltage $V_{IN}$ is output.

In a case in which each of the switch elements is switched to ON, a voltage which is rapidly raised in accordance with the operation of each of the switch elements (the input voltage $V_{IN}$) is input into the target circuit 2820 and the auxiliary circuit 2830. Accordingly, as with the case at the first time T1, the auxiliary voltage generated by the auxiliary circuit 2830 is output to the application point 2823 of the target circuit 2820, and the voltage of the application point 2823 (the output point 2822) is promptly raised to $V_{IN}/2$.

Accordingly, even in a case in which the target circuit 2820 returns (intermittently returns) to the start-up state from the dormant state, it is possible for the target circuit 2820 to promptly return to the start-up state. Note that, each of the switch elements is switched to OFF at a fourth time T4, and the target circuit 2820 proceeds again to the dormant state. The length of the start-up state and the dormant state, the timing for switching each of the states, and the like are not limited, and for example, may be suitably set in accordance with a period, a timing, and the like when the output voltage $V_{OUT}$ is necessary.

Thus, the target circuit 2820 performs an intermittent operation of alternately repeating the start-up state in which the output voltage $V_{OUT}$ is output, and the dormant state. Accordingly, for example, it is possible to drive the target circuit 2820 only when necessary, and it is possible to sufficiently reduce power which is consumed by the target circuit 2820. As a result thereof, it is possible to realize considerably low power consumption of the electric circuit 2800.

A method of intermittently operating the circuit is considered as a method for realizing low power consumption of the circuit. In such a circuit, an operation time ratio which is a ratio of an operation period (a time from the start to the end of the operation) of the circuit decreases, and thus, the average power is reduced. On the other hand, in the dormant period, there is the upper limit in accordance with operation properties, the application, and the like of the other circuit. For this reason, it is extremely important to reduce the operation period of the circuit including the start-up time.

In an electric circuit 2900 according to this embodiment, a target circuit 2920 and an auxiliary circuit 2930 are simultaneously started up. In accordance with such a start-up timing, a transient current (a high-frequency current) passing through the auxiliary circuit 2930 flows into an application point 2923, and the auxiliary voltage which is generated by the auxiliary circuit 2930 is output to the application point 2923. Thus, a sufficient current and a sufficient voltage are promptly supplied to the application point 2923 by the auxiliary circuit 2930, in accordance with intermittent return of the target circuit 2920. Accordingly, it is possible to considerably reduce a start-up time of the target circuit 2920.

The start-up time of the target circuit 2820 is reduced, and thus, it is possible to sufficiently reduce an operation time ratio of the target circuit 2820 in the intermittent operation. Accordingly, power which is consumed by the target circuit 2920 is reduced, and it is possible to realize the electric circuit 2800 of extremely low power consumption.

In addition, for example, it is possible to intermittently operate a high-impedance electric circuit and the like which take time to be started up. That is, it is possible to configure an electric circuit which is capable of performing the intermittent operation with low power consumption by using the auxiliary circuit 2830. As a result thereof, it is possible to realize an electric circuit of extremely low power consumption according to the intermittent operation, an electronic apparatus, a system, and the like.

Note that, the operation of the intermittent operation control circuit 2890 described above, and the like can be applied to not only an electric circuit which exhibits an effect only by the target circuit 2820 and the auxiliary circuit 2830 illustrated in FIG. 32, but also an electric circuit having other configurations. For example, the operation and the like can also be applied to a case in which the target circuit is another voltage-dividing circuit (FIG. 7, FIG. 11, and FIG. 12), another comparison circuit (FIG. 18), another constant voltage circuit (FIG. 19 to FIG. 21), and another amplification circuit (FIG. 22, FIG. 23, FIG. 26, and FIG. 27), and the like.

Fourth Embodiment

FIG. 34 is a circuit diagram illustrating a configuration example of an electric circuit 2900 according to a fourth embodiment. The electric circuit 2900 includes a power supply source 2910, a target circuit 2920, an auxiliary circuit 2930, a driving circuit 2940, a start-up control circuit 2960, an intermittent switch element 2991, and an intermittent operation control circuit 2990. In addition, the electric circuit 2900 includes an input point 50, a branch point 51, and a ground point 52.

The power supply source 2910, the target circuit 2920, the auxiliary circuit 2930, and the driving circuit 2940 of the electric circuit 2900 illustrated in FIG. 34 have configurations which are respectively identical to those of the power supply source 210, the target circuit 220, the auxiliary circuit 230, and the driving circuit 240 of the electric circuit 200 illustrated in FIG. 5.

The power supply source 2910 outputs the input voltage $V_{IN}$ to the input point 50. The input point 50 is connected to the branch point 51. The target circuit 2920 has a configuration in which a first MOS transistor 2921a to a fourth MOS transistor 2921d are connected in series. The target circuit 2920 divides the input voltage $V_{IN}$ into ½, generates the output voltage $V_{OUT}$, and outputs the output voltage $V_{OUT}$ to the driving circuit 2940.

The auxiliary circuit 2930 has a configuration in which a first resistance element 2935a and a second resistance element 2936b are connected in series. In addition, a first switch element 2936a is provided between the first resistance element 2935a and the branch point 51, a second switch element 2936b is provided between an intermediate point 2932 in each of the resistance elements and the application point 2923 of the target circuit 2920. The auxiliary circuit 2930 divides the input voltage $V_{IN}$ into ½, generates the auxiliary voltage, and outputs the auxiliary voltage to the application point 2923 of the target circuit 2920.

The intermittent switch element 2991 is provided between the branch point 51 and the first MOS transistor 2921a of the target circuit 2920. As illustrated in FIG. 34, in a case in which the intermittent switch element 2991 is turned ON (OFF), wiring between the power supply source 2910 (the branch point 51) and the target circuit 2920 becomes conductive (is cut off).

The intermittent operation control circuit 2990 controls the switching of ON/OFF of the intermittent switch element 2991. The intermittent operation control circuit 2990 outputs a first control signal for controlling the intermittent switch element 2991 (in FIG. 34, represented as Enable). The first control signal is input into a control terminal (not illustrated) of the intermittent switch element and the start-up control circuit 2960.

The start-up control circuit 2960 controls the switching of the first switch element 2935a and the second switch element 2935b. The start-up control circuit 2960 outputs a second control signal for controlling each of the switch elements (in FIG. 34, represented as Start), on the basis of the first control signal which is output from the intermittent operation control circuit 2990. The second control signal is input into a control terminal (not illustrated) of the first switch element 2935a and the second switch element 2935b.

In this embodiment, the second control signal is output in synchronization with the first control signal by the start-up control circuit 2960. Accordingly, the first switch element 2935a and the second switch element 2935b are controlled in synchronization with the operation of the intermittent switch element 2991. For example, control of simultaneously switching the first switch element 2935a and the second switch element 2935b to ON is performed in accordance with a timing when the intermittent switch element 2991 is switched to ON.

Figure 35:
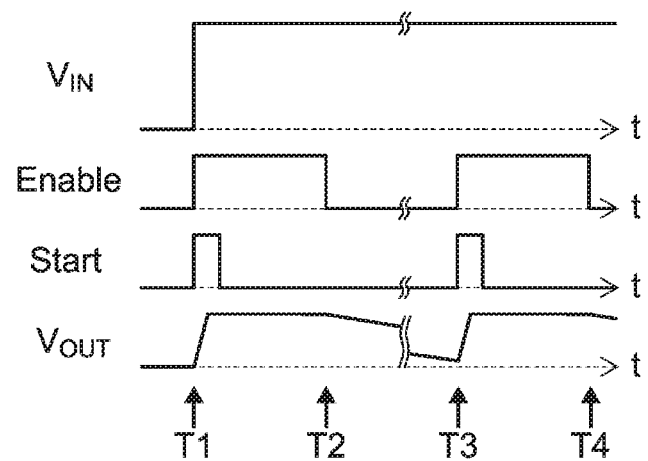
FIG. 35 is a schematic view for illustrating an operation waveform of the electric circuit illustrated in FIG. 34.

FIG. 35 is a schematic view for illustrating an operation waveform of the electric circuit 2900 illustrated in FIG. 34. In FIG. 35, the waveform of the input voltage $V_{IN}$ which is output from the power supply unit 2910, the waveform of the first control signal (Enable) which is output from the intermittent operation control circuit 2990, the waveform of the second control signal (Start) which is output from the start-up control circuit 2960, and the waveform of the output voltage $V_{OUT}$ which is output from the target circuit 2920 are schematically illustrated along the time axis t.

The input voltage $V_{IN}$ is output at the first time T1 by the power supply source 2910. The first control signal for setting the intermittent switch element 2991 to be ON is output approximately simultaneously with the first time T1 by the intermittent operation control circuit 2990. The second control signal is output in synchronization with the first control signal by the start-up control circuit 2960.

The intermittent switch element 2991 is switched to ON on the basis of the first control signal. In addition, the first switch element 2935a and the second switch element 2935b are switched to ON at the same timing, on the basis of the second control signal. Accordingly, the input voltage $V_{IN}$ are approximately simultaneously input into the target circuit 2920 and the auxiliary circuit 2930.

In the auxiliary circuit 2930, the input voltage $V_{IN}$ is divided into ½, and the auxiliary voltage is generated, and is output to the application point 2923. In addition, a current passing through the first resistance element 2935a is input into the application point 2923. As a result thereof, the voltage of the application point 2923 (the output point 2922) is promptly raised to $V_{IN}/2$, and the target circuit 2920 proceeds to the start-up state. Accordingly, it is possible to sufficiently reduce the start-up time of the target circuit 2920.

The start-up control circuit 2960 changes the second control signal to be in the OFF state after a predetermined time has elapsed from the first time T1, the first switch element 2935a and the second switch element 2935b are switched to OFF. At this time, the first control signal is maintained in the ON state, and the intermittent switch element is maintained in the ON state. That is, power supply with respect to the auxiliary circuit 2930 is cut, and power supply with respect to the target circuit 2920 is continuously performed. For this reason, in a case in which the target circuit 2920 is in the start-up state, a current and the like do not flow to the auxiliary circuit 2930, and power consumption does not increase.

The intermittent switch element 2991 is switched to OFF at the second time T2 by the intermittent operation control circuit 2990. As a result thereof, the power supply with respect to the target circuit 2920 is cut, and the target circuit 2920 proceeds to the dormant state from the start-up state in which the output voltage $V_{OUT}$ is output. Note that, the input voltage $V_{IN}$ which is output from the power supply unit 2910 is not cut.

A signal for returning the operation of the target circuit 2920 (the first control signal) is output at the third time T3 by the intermittent operation control circuit 2990. As with the case at the first time T1, the start-up control circuit 2960 controls the first switch element 2935a and the second switch element 2935b, and promptly start up the target circuit 2920. The target circuit 2920 which has proceeded to the start-up state, is proceeds again to the dormant state at the fourth time T4.

As described above, in this embodiment, the intermittent operation control circuit 2990 and the start-up control circuit 2960 are synchronized with each other, and thus, the intermittent switch element, and the first switch element 2935a and the second switch element 2935b are controlled with a high accuracy. Accordingly, even in a case in which a stationary current flows to the auxiliary circuit 2930, each of the switch elements is controlled, and thus, power consumption of the auxiliary circuit 2930 is suppressed, and it is possible to control a current amount flowing into the target circuit 2920 with a high accuracy. Accordingly, it is possible to intermittently operate various electric circuits, and it is possible to realize considerably low power consumption.

Note that, the combined operation of the intermittent operation control circuit 2990 and the start-up control circuit 2960 described above, and the like can be applied to not only an electric circuit which exhibits an effect only by the target circuit 2920 and the auxiliary circuit 2930 illustrated in FIG. 34, but also an electric circuit having other configurations. For example, the operation and the like can also be applied to a case in which the target circuit is another voltage-dividing circuit (FIG. 8 to FIG. 10, and FIG. 13 to FIG. 15), another constant current circuit (FIG. 16 and FIG. 17), another comparison circuit (FIG. 18), another constant voltage circuit (FIG. 19 to FIG. 21), and another amplification circuit (FIG. 22, FIG. 24 to 26, and FIG. 28 to FIG. 31), and the like.

Other Embodiments

The present technology is not limited to the embodiments described above, and is capable of realizing other various embodiments.

In the embodiments described above, the intermittent operation of the target circuit is controlled by the switch element which controls the supply of the power (the input voltage $V_{IN}$) with respect to the target circuit and the auxiliary circuit, and the intermittent operation control circuit which controls the operation of the switch element. A method of controlling the intermittent operation, and the like are not limited, and for example, the intermittent operation of the target circuit may be controlled by using the input voltage $V_{IN}$.

For example, the input voltage $V_{IN}$ having a pulse waveform corresponding to the ON state and the OFF state can be used as the method of controlling the intermittent operation. In this case, for example, a pulse-like input voltage $V_{IN}$ including a predetermined voltage (Von) corresponding to the ON state and a predetermined voltage (Voff) corresponding to the OFF state is output from the power supply source and the like.

For example, in the electric circuit 100 illustrated in FIG. 1, the pulse-like input voltage $V_{IN}$ is input into the target circuit 20 and the auxiliary circuit 30. The auxiliary circuit 30 generates the auxiliary voltage, and outputs the auxiliary voltage to the application point 23 of the target circuit 20, in accordance with a timing when the input voltage $V_{IN}$ is switched to Von from Voff (the start-up timing of the target circuit 20). As a result thereof, the target circuit 20 promptly proceeds to the start-up state. In addition, in a case in which the input voltage $V_{IN}$ is switched to Voff from Von, the target circuit 20 proceeds to the dormant state.

In addition, for example, in the electric circuit 200 illustrated in FIG. 2, it is possible to intermittently operate the target circuit 220 by using the pulse-like input voltage $V_{IN}$. In this case, for example, the control signal (Start) is output from the start-up control circuit 60 in synchronization with a timing when the input voltage $V_{IN}$ is switched to Von from Voff. As a result thereof, the auxiliary voltage is temporarily output to the application point 223 of the target circuit 220 from the auxiliary circuit 230, and the target circuit 220 promptly proceeds to the start-up state. It is obvious that the pulse-like input voltage $V_{IN}$ and the like are suitably input into the other electric circuits described above, and thus, the intermittent operation can be realized.

Thus, it is possible to control the intermittent operation of the target circuit by using the pulse-like input voltage $V_{IN}$. Accordingly, it is possible to easily realize the intermittent operation without adding a new switch element and the like, and it is possible to realize considerably low power consumption.

It is also possible to combine at least two characteristic portions in the characteristic portions according to the present technology described above. That is, various characteristic portions described in each of the embodiments may be arbitrarily combined without distinction of each of the embodiments. In addition, various effects described above are merely an example, and are not limited, and other effects may be exhibited.

Note that, the present technology can also be configured as follows.

(1) An electric circuit, including:
a target circuit including an output portion from which predetermined output power is output, and an application point to which a voltage corresponding to the output power is applied to output the output power; and
an auxiliary circuit which has impedance lower than impedance of the target circuit, and outputs the voltage corresponding to the output power to the application point as an auxiliary voltage.

(2) The electric circuit according to (1), in which
the auxiliary circuit outputs the auxiliary voltage to the application point in accordance with a start-up timing of the target circuit.

(3) The electric circuit according to (1) or (2), in which
the target circuit includes a first wiring portion which is connected to a first power supply source, and in which impedance to the application point is first impedance, and
the auxiliary circuit includes a second wiring portion which is connected to a second power supply source, and in which impedance to the application point is second impedance lower than the first impedance.

(4) The electric circuit according to (3), in which
the first power supply source and the second power supply source are an identical power supply source.

(5) The electric circuit according to (3) or (4), in which
the second wiring portion is connected to the application point, passes a high-frequency current, and regulates a stationary current.

(6) The electric circuit according to (5), in which
the auxiliary circuit includes a capacitance circuit which is provided to output the auxiliary voltage.

(7) The electric circuit according to (3), in which
the second wiring portion includes a start-up switch portion which is connected to the application point, is capable of passing a stationary current, and is provided between the second power supply source and the application point.

(8) The electric circuit according to (7), in which
the start-up switch portion makes a path between the second power supply source and the application point conductive in accordance with a start-up timing of the target circuit, and cuts off the path after a predetermined time has elapsed.

(9) The electric circuit according to (7) or (8), in which
the auxiliary circuit includes at least one of a resistance circuit for outputting the auxiliary voltage or a replica circuit which outputs the auxiliary voltage.

(10) The electric circuit according to any one of (7) to (9), in which
the first wiring portion and the second wiring portion include a common wiring portion which is wiring common to each of the first wiring portion and the second wiring portion, and
the start-up switch portion is provided on wiring of the second wiring portion, the wiring being different from the common wiring portion.

(11) The electric circuit according to (10), in which
wiring of the first wiring portion, which is different from the common wiring portion, is configured to have high impedance, and
the wiring of the second wiring portion, which is different from the common wiring portion and is provided with the start-up switch portion, is configured to have low impedance.

(12) The electric circuit according to any one of (1) to (11), in which the output portion outputs a predetermined voltage as the output power, and the auxiliary circuit outputs the predetermined voltage to the application point as the auxiliary voltage.

(13) The electric circuit according to any one of (1) to (12), in which the output portion includes an output point which outputs the output power, and the auxiliary circuit outputs the predetermined voltage to the output point of the output portion as the auxiliary voltage.

(14) The electric circuit according to any one of (3) to (14), in which the target circuit performs an intermittent operation of alternately repeating a start-up state in which the output power is output and a dormant state.

(15) The electric circuit according to (14), further including an intermittent switch portion which is provided between the first wiring portion and the first power supply source, in which the target circuit is in the start-up state in a case in which the intermittent switch portion is turned ON, and is in the dormant state in a case in which the intermittent switch portion is turned OFF.

(16) The electric circuit according to (15), in which the intermittent switch portion includes a first switch portion which is provided between the first wiring portion and the first power supply source, and a second switch portion which is provided between the second wiring portion and the second power supply source and is operated in synchronization with the first switch portion.

(17) The electric circuit according to (15) or (16), in which the second wiring portion includes a start-up switch portion which is connected to the application point, is capable of passing a stationary current, and is provided between the second power supply source and the application point, and the intermittent switch portion and the start-up switch portion are operated in synchronization with each other.

(18) The electric circuit according to any one of (1) to (17), in which the target circuit includes a plurality of the application points to each of which a voltage corresponding to the output power is applied, when the output power is output, and the auxiliary circuit outputs an auxiliary voltage corresponding to each of the plurality of application points.

REFERENCE SIGNS LIST 20, 220, 320, 420, 520, 620, 720, 820, 920, 1020, 1120, 1220, 1320, 1420, 1520, 1620, 1720, 1820, 2220, 2820, 2920 target circuit
30, 230, 330, 430, 530, 630, 730, 830, 930, 1030, 1130, 1230, 1330, 1430, 1530, 1630, 1830, 1930, 2030, 2130, 2230, 2330, 2430, 2530, 2630, 2730, 2830, 2930 auxiliary circuit
1730a first auxiliary circuit
1730b second auxiliary circuit
23, 223, 323, 423, 523, 623, 723, 823, 923, 1023, 1123, 1223, 1323, 1823, 2223, 2823, 2923 application point
1423a first application point
1423b second application point

The invention claimed is:

1. An electric circuit, comprising:
a target circuit including:
an application point configured to:
receive an auxiliary voltage; and
output an output power based on the auxiliary voltage;
a first wiring portion connected to a power supply source, wherein the first wiring portion includes a first impedance; and
an output portion configured to:
receive the output power from the application point; and
output the received output power;
a start-up control circuit; and
an auxiliary circuit that includes a second wiring portion connected to the power supply source, wherein
the auxiliary circuit is configured to output the auxiliary voltage to the application point,
the second wiring portion is between the power supply source and the application point,
the second wiring portion is configured to pass a stationary current, and
the second wiring portion includes:
a specific element that has a second impedance lower than the first impedance of the target circuit; and
a start-up switch portion connected to the application point, wherein
the start-up switch portion includes:
a first switch element coupled between the power supply source and the specific element; and
a second switch element coupled between the specific element and the application point,
the start-up control circuit is configured to control the first switch element and the second switch element, and
the first switch element and the second switch element are different from the specific element of the second wiring portion.

2. The electric circuit according to claim 1, wherein the auxiliary circuit is further configured to output the auxiliary voltage to the application point based on a start-up timing of the target circuit.

3. The electric circuit according to claim 1, wherein the start-up switch portion is configured to:
conduct a path between the power supply source and the application point based on a start-up timing of the target circuit; and
cut off the path after elapse of a specific time.

4. The electric circuit according to claim 1, wherein the auxiliary circuit further includes at least one of:
a resistance circuit configured to output the auxiliary voltage, or
a replica circuit configured to output the auxiliary voltage.

5. The electric circuit according to claim 1, wherein
each of the first wiring portion and the second wiring portion further includes a common wiring portion common to each of the first wiring portion and the second wiring portion,
the start-up switch portion is on a first specific wiring of the second wiring portion, and
the first specific wiring is different from the common wiring portion.

6. The electric circuit according to claim 5, wherein
the first wiring portion further includes a second specific wiring different from the common wiring portion, the second specific wiring is configured to have high impedance, the first specific wiring of the second wiring portion is connected with the start-up switch portion, and the first specific wiring is configured to have low impedance.

7. The electric circuit according to claim 1, wherein the output portion is further configured to output the auxiliary voltage as the output power.

8. The electric circuit according to claim 1, wherein the output portion includes an output point configured to output the received output power, and the auxiliary circuit is further configured to output the auxiliary voltage to the output point of the output portion.

9. The electric circuit according to claim 1, wherein the target circuit is configured to execute an intermittent operation to alternately repeat a start-up state in which the output power is output and a dormant state.

10. The electric circuit according to claim 9, further comprising an intermittent switch portion between the first wiring portion and the power supply source, wherein the target circuit is in the start-up state based on turn on of the intermittent switch portion, and the target circuit is in the dormant state based on turn off of the intermittent switch portion.

11. The electric circuit according to claim 10, wherein the intermittent switch portion includes:

a first switch portion between the first wiring portion and the power supply source; and a second switch portion between the second wiring portion and the power supply source, wherein the second switch portion is configured to operate in synchronization with the first switch portion.

12. The electric circuit according to claim 10, wherein the intermittent switch portion is configured to operate in synchronization with the start-up switch portion.

13. The electric circuit according to claim 1, wherein the target circuit further includes a plurality of application points, each application point of the plurality of application points is configured to receive the auxiliary voltage corresponding to the output power, and the auxiliary circuit is further configured to output the auxiliary voltage to each application point of the plurality of application points.

14. An electronic apparatus, comprising:

an electric circuit including:

a target circuit including:

an application point configured to:

receive an auxiliary voltage; and output an output power based on the auxiliary voltage;

a first wiring portion connected to a power supply source, wherein the first wiring portion includes a first impedance; and an output portion configured to:

receive the output power from the application point; and output the received output power;

a start-up control circuit; and an auxiliary circuit that includes a second wiring portion connected to the power supply source, wherein the auxiliary circuit is configured to output the auxiliary voltage to the application point, the second wiring portion is between the power supply source and the application point, the second wiring portion is configured to pass a stationary current, and the second wiring portion includes:

a specific element that has a second impedance lower than the first impedance of the target circuit; and a start-up switch portion connected to the application point, wherein the start-up switch portion includes:

a first switch element coupled between the power supply source and the specific element; and a second switch element coupled between the specific element and the application point, the start-up control circuit is configured to control the first switch element and the second switch element, and the first switch element and the second switch element are different from the specific element of the second wiring portion; and a driving unit configured to be driven based on the output power output from the output portion of the target circuit.

* * * * *